(12) United States Patent
Takenaga et al.

(10) Patent No.: US 8,518,562 B2
(45) Date of Patent: Aug. 27, 2013

(54) MAGNETIC STORAGE DEVICE

(75) Inventors: Takashi Takenaga, Tokyo (JP);
Takeharu Kuroiwa, Tokyo (JP);
Hiroshi Takada, Tokyo (JP); Ryoji Matsuda, Tokyo (JP); Yosuke Takeuchi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 449 days.

(21) Appl. No.: 12/617,469

(22) Filed: Nov. 12, 2009

(65) Prior Publication Data

US 2010/0151276 A1 Jun. 17, 2010

(30) Foreign Application Priority Data

Dec. 15, 2008 (JP) ................................ 2008-318617

(51) Int. Cl.
*H01L 29/82* (2006.01)
*G11C 11/02* (2006.01)

(52) U.S. Cl.
USPC .......... 428/811.5; 257/20; 257/414; 257/421; 257/422; 257/423; 257/427; 257/E29.323; 365/157; 365/158; 365/171; 360/324; 360/324.2

(58) Field of Classification Search
None
See application file for complete search history.

(56) References Cited

U.S. PATENT DOCUMENTS

| 5,465,185 | A | 11/1995 | Heim et al. |
| 6,005,800 | A | 12/1999 | Koch et al. |
| 6,104,633 | A | 8/2000 | Abraham et al. |
| 6,165,803 | A | 12/2000 | Chen et al. |
| 6,570,783 | B1 | 5/2003 | Deak |
| 6,605,836 | B2 | 8/2003 | Kishi et al. |
| 6,765,824 | B2 * | 7/2004 | Kishi et al. ..................... 365/173 |
| 6,798,691 | B1 * | 9/2004 | Ounadjela et al. ............. 365/171 |
| 7,715,154 | B2 * | 5/2010 | Covington et al. ...... 360/324.12 |
| 8,013,407 | B2 * | 9/2011 | Takenaga et al. ............. 257/421 |

(Continued)

FOREIGN PATENT DOCUMENTS

JP    2786601 B2    8/1998
JP    11-273337    10/1999

(Continued)

OTHER PUBLICATIONS

D.H. Mosca et al., "Oscillatory interlayer coupling and giant magnetoresistance in Co/Cu multilayers," Journal of Magnetism and Magnetic Materials 94, pp. L1-L5, 1991.

(Continued)

*Primary Examiner* — Kevin Bernatz
(74) *Attorney, Agent, or Firm* — McDermott Will & Emery LLP

(57) ABSTRACT

A magnetic storage device stable in write characteristic is provided. A first nonmagnetic film is provided over a recording layer. A first ferromagnetic film is provided over the first nonmagnetic film and has a first magnetization and a first film thickness. A second nonmagnetic film is provided over the first ferromagnetic film. A second ferromagnetic film is provided over the second nonmagnetic film, is coupled in antiparallel with the first ferromagnetic film, and has a second magnetization and a second film thickness. An antiferromagnetic film is provided over the second ferromagnetic film. The sum of the product of the first magnetization and the first film thickness and the product of the second magnetization and the second film thickness is smaller than the product of the magnetization of the recording layer and the film thickness of the recording layer.

20 Claims, 12 Drawing Sheets

(56) References Cited

U.S. PATENT DOCUMENTS

| | | | |
|---|---|---|---|
| 8,139,402 B2 * | 3/2012 | Tanizaki et al. | 365/158 |
| 8,269,295 B2 * | 9/2012 | Takenaga et al. | 257/421 |
| 8,362,581 B2 * | 1/2013 | Takenaga et al. | 257/421 |
| 2001/0012188 A1 * | 8/2001 | Hasegawa et al. | 360/324.12 |
| 2003/0090932 A1 * | 5/2003 | Deak | 365/158 |
| 2006/0067116 A1 * | 3/2006 | Hayakawa et al. | 365/171 |
| 2006/0267058 A1 * | 11/2006 | Takenaga et al. | 257/295 |
| 2008/0117553 A1 * | 5/2008 | Carey et al. | 360/324.2 |
| 2008/0204944 A1 * | 8/2008 | Aikawa et al. | 360/324.1 |
| 2009/0298200 A1 * | 12/2009 | Guo et al. | 438/3 |

FOREIGN PATENT DOCUMENTS

| | | |
|---|---|---|
| JP | 2000-353791 | 12/2000 |
| JP | 2002-280637 | 9/2002 |
| JP | 2004-296858 | 10/2004 |
| JP | 2005-310971 | 11/2005 |

OTHER PUBLICATIONS

S.S.P. Parkin et al., "Oscillatory Magnetic Exchange Coupling through Thin Copper Layers," Apr. 1991, Physical Review Letters, vol. 66, No. 16, pp. 2152-2155.

W.P. Pratt et al., "Perpendicular Giant Magnetoresistances of Ag/Co Multilayers," Jun. 1991, Physical Review Letters, vol. 66, No. 23, pp. 3060-3063.

T. Miyazaki et al., "Giant magnetic tunneling effect in Fe/Al2O3/Fe junction," Journal of Magnetism and Magnetic Materials 139 (1995), pp. L231-L234.

S. Tehrani et al., "High density submicron magnetoresistive random access memory (invited)," Apr. 1999, Journal of Applied Physics, vol. 85, No. 8, pp. 5822-5827.

S.S.P. Parkin et al., "Exchange-biased magnetic tunnel junctions and application to nonvolatile magnetic random access memory (invited)," Apr. 1999, Journal of Applied Physics, vol. 85, No. 8, pp. 5828-5833.

ISSCC 2001 Dig. Of Tech. Papers, p. 122.

* cited by examiner

S-SHAPED STRUCTURE

C-SHAPED STRUCTURE

MAGNETIC STORAGE DEVICE

CROSS-REFERENCE TO RELATED APPLICATIONS

The disclosure of Japanese Patent Application No. 2008-318617 filed on Dec. 15, 2008 including the specification, drawings and abstract is incorporated herein by reference in its entirety.

BACKGROUND OF THE INVENTION

The present invention relates to magnetic storage devices and in particular to a magnetic storage device having a recording layer and an anchoring layer.

Magnetoresistive (MR) effect is a phenomenon that when a magnetic field is applied to a magnetic material, its electrical resistance varies and this phenomenon is utilized in magnetic field sensors, magnetic heads, and the like. As giant magnetoresistance (GMR) effect materials that exert especially profound magnetoresistance effect, artificial lattice films of Fe/Cr, Co/Cu, and the like are introduced in Non-patent Documents 1 and 2.

There is proposed a magnetoresistance effect element using a laminated structure of a ferromagnetic layer (free layer)/nonmagnetic layer/ferromagnetic layer (pin layer)/antiferromagnetic layer having a nonmagnetic metal layer thick to the extent that the exchange coupling action between the ferromagnetic layers is eliminated. In this element, the pin layer and the antiferromagnetic layer are exchange-coupled with each other and the magnetic moment of this ferromagnetic layer is fixed and only the spin of the free layer can be easily inverted by an external magnetic field. This is the element known as a so-called spin valve film. In this element, the exchange coupling between two ferromagnetic layers is weak and thus the spin of a free layer is inverted by a small magnetic field. For this reason, spin valve films can provide a magnetoresistive element having higher sensitivity than the above exchange coupling film can. As the antiferromagnetic material, FeMn, IrMn, PtMn, or the like is used. When this spin valve film is used, a current is passed in a film in-plane direction and it is used for reproducing heads for high-density magnetic recording because of the above-mentioned features.

A technology in which a laminated film of a ferromagnetic film/nonmagnetic film/ferromagnetic film is used for the above pin layer and the respective magnetizations of the two ferromagnetic films are coupled in antiparallel is disclosed, for example, in Patent Document 1. It is known that the influence of a pin layer on a free layer is smaller when this structure is used than when a single ferromagnetic film is used.

Non-patent Document 3 shows that the utilization of perpendicular magnetoresistance effect obtained by passing a current perpendicularly to a film surface makes it possible to obtain a profounder magnetoresistance effect.

In addition, Non-patent Document 4 shows tunneling magnetoresistive (TMR) effect arising from ferromagnetic tunnel junction. This tunnel magnetoresistance utilizes the following phenomenon in a three-layer film of a ferromagnetic layer/insulating layer/ferromagnetic layer: the magnitude of tunnel current perpendicular to a film surface is varied by making the spins of the two ferromagnetic layers parallel or antiparallel by an external magnetic field.

In recent years, for example, Non-patent Documents 5 to 7 describe researches on the utilization of GMR and TMR elements for nonvolatile magnetic storage semiconductor devices (MRAMs: Magnetic Random Access Memories).

In these cases, considerations have been given to pseudo-spin valve elements and ferromagnetic tunnel effect elements in which a nonmagnetic metal layer is sandwiched between two ferromagnetic layers different in coercive force. When such elements are utilized for MRAM, "1" and "0" are recorded by arranging these elements in a matrix pattern, passing a current through a separately provided wiring to apply a magnetic field, and controlling the two magnetic layers comprising each element into parallel and antiparallel. The GMR or TMR effect is utilized to read them.

In MRAMs, a power consumption is lower when the TMR effect is utilized than when the GMR effect is utilized; therefore, consideration is given to utilizing mainly TMR elements. In MRAMs utilizing TMR elements, the rate of MR change is as high as 20% or above at room temperature and the resistance in tunnel junctions is high; therefore, larger output voltage is obtained. In MRAMs utilizing TMR elements, further, it is unnecessary to invert spin in reading information and thus information can accordingly be read by a small current. For this reason, MRAMs utilizing TMR elements are expected as low-power consumption nonvolatile semiconductor storage devices capable of high-speed writing and reading.

In write operation with MRAMs, it is desired to control the magnetic characteristic of the ferromagnetic layers in each TMR element. Specifically, the following technologies are desired: a technology for controlling the relative direction of magnetization between two ferromagnetic layers sandwiching a nonmagnetic layer between them into parallel and antiparallel; and a technology for reliably and efficiently reversing the magnetization of one magnetic layer in a desired cell. For example, Patent Documents 2, 4, and 5 disclose technologies for uniformly controlling the relative direction of magnetization between two ferromagnetic layers sandwiching a nonmagnetic layer between them into parallel and antiparallel in a film surface using two crossing wirings.

In MRAMs, the following takes place when cells are miniaturized for higher degrees of integration: a reversed magnetic field is enlarged by a demagnetizing field depending on the size of a magnetic layer in the direction of its film surface. As a result, a large magnetic field is required when information is written and this increases power consumption as well. To cope with this, technologies for optimizing the shape of ferromagnetic layers and facilitating magnetization reversal have been proposed as disclosed in Patent Documents 3, 6, 7, and 8.

[Non-patent Document 1] D. H. Mosca et al., "Oscillatory interlayer coupling and giant magnetoresistance in Co/Cu multilayers," Journal of Magnetism and Magnetic Materials 94 (1991) pp. L1-L5

[Non-patent Document 2] S. S. P. Parkin et al., "Oscillatory Magnetic Exchange Coupling through Thin Copper Layers," Physical Review Letters, vol. 66, No. 16, 22 Apr. 1991, pp. 2152-2155

[Non-patent Document 3] W. P. Pratt et al., "Perpendicular Giant Magnetoresistances of Ag/Co Multilayers," Physical Review Letters, vol. 66, No. 23, 10 Jun. 1991, pp. 3060-3063

[Non-patent Document 4] T. Miyazaki et al., "Giant magnetic tunneling effect in Fe/Al2O3/Fe junction," Journal of Magnetism and Magnetic Materials 139 (1995), pp. L231-L234

[Non-patent Document 5] S. Tehrani et al., "High density submicron magnetoresistive random access memory (invited)," Journal of Applied Physics, vol. 85, No. 8, 15 Apr. 1999, pp. 5822-5827

[Non-patent Document 6] S. S. P. Parkin et al., "Exchange-biased magnetic tunnel junctions and application to nonvolatile magnetic random access memory (invited)," Journal of Applied Physics, vol. 85, No. 8, 15 Apr. 1999, pp. 5828-5833

[Non-patent Document 7] ISSCC 2001 Dig of Tech. Papers, p. 122

[Patent Document 1] Japanese Patent No. 2786601

[Patent Document 2] Japanese Unexamined Patent Publication No. Hei 11 (1999)-273337

[Patent Document 3] Japanese Unexamined Patent Publication No. 2002-280637

[Patent Document 4] Japanese Unexamined Patent Publication No. 2000-353791

[Patent Document 5] U.S. Pat. No. 6,005,800 Specification

[Patent Document 6] Japanese Unexamined Patent Publication No. 2004-296858

[Patent Document 7] U.S. Pat. No. 6,570,783 Specification

[Patent Document 8] Japanese Unexamined Patent Publication No. 2005-310971

SUMMARY OF THE INVENTION

However, conventional MRAMs involve the following problems:

According to Patent Document 3, the memory cells of MRAMs require two crossing wiring layers, a magnetic storage element, a transistor element, and a coupling member that electrically couples the magnetic storage element and the transistor element. The magnetic storage element includes a recording layer of ferromagnetic material, a pin layer, and a nonmagnetic layer sandwiched between the recording layer and the pin layer.

In reading of information, a current passed through a magnetic storage element via a predetermined wiring is detected based on the resistance of the magnetic storage device. In writing of information, meanwhile, the direction of magnetization of the recording layer of a specific magnetic storage element to which a synthetic magnetic field produced by passing a current through both of two crossing wiring layers is selectively reversed. At this time, the shape of the recording layer in the magnetic storage element is made symmetric with respect to a hard axis of magnetization and asymmetric with respect to an easy axis of magnetization. This makes it possible to expand a magnetic field range in which information can be written. The foregoing is disclosed in Patent Documents 5 and 6.

In high-integration devices, such as MRAMs, it is virtually impossible to make the recording layers identical in shape in all magnetic storage elements and this problem becomes more notable as the recording layers are more miniaturized. That is, the shape of a recording layer largely varies from one memory cell to another because of difficulty in controlling photolithography. For this reason, variation is produced in write characteristic from one memory cell to another and this increases variation in write characteristic from one magnetic storage device to another.

In recording layers having the above-mentioned asymmetry, magnetization distribution is controlled by shape. When the shape varies, therefore, the write characteristic varies from bit to bit. To reliably write information into each bit under the presence of this variation, it is required to increase a set value of write current. As a result, especially, a magnetic field applied to a hard axis of magnetization is enlarged and thus the magnetization of a pin layer is rotated. When a structure in which a pin layer is comprised of a ferromagnetic film/nonmagnetic film/ferromagnetic film is used, magnetizations in the two ferromagnetic films antiparallel coupled with each other get out of balance and as a result, interaction occurs between the pin layer and the recording layer. The write current becomes more difficult to control because of its influence.

That is, magnetic storage elements having a recording layer shape asymmetric with respect to an easy axis of magnetization involve a problem that the operation of the magnetic storage device becomes unstable when they are miniaturized.

The invention has been made with the above problem taken into account and it is an object of the invention to provide a magnetic storage device stable in write characteristic.

A magnetic storage device of the invention includes: a substrate; first and second wirings, a recording layer, a first nonmagnetic layer, and an anchoring layer. The first wiring is provided over the substrate and has a portion extended along a first axis when the first axis is taken as central axis. The second wiring is provided over the substrate, has a portion extended along a second axis crossing the first axis when the second axis is taken as central axis, and crosses the first wiring with a gap provided in the direction of the thickness of the substrate. The recording layer has a planar shape and arranged so that at least part thereof is sandwiched between the first wiring and the second wiring in a area where the first wiring and the second wiring cross each other with a gap in-between. The recording layer has an easy axis of magnetization and its magnetization direction is varied by a synthetic magnetic field of a magnetic field arising from the first wiring and a magnetic field arising from the second wiring. The first nonmagnetic film is provided over the recording layer. The anchoring layer is provided over the first nonmagnetic film. The anchoring layer includes: a first ferromagnetic film provided over the first nonmagnetic film and having a first magnetization and a first film thickness; a second nonmagnetic film provided over the first ferromagnetic film; a second ferromagnetic film provided over the second nonmagnetic film, antiparallel coupled with the first ferromagnetic film, and having a second magnetization and a second film thickness; and an antiferromagnetic film provided over the second ferromagnetic film. The sum of the product of the first magnetization and the first film thickness and the product of the second magnetization and the second film thickness is smaller than the product of the magnetization of the recording layer and the film thickness of the recording layer.

According to the invention, the following is implemented even when the respective magnetizations of the first and second ferromagnetic films included in the anchoring layer in antiparallel state is made closer to parallel state by the synthetic magnetic field arising from the first and second wirings: the magnetic moment of the entire anchoring layer is prevented from becoming so large that it exceeds the magnetic moment of the recording layer. This suppresses the influence of change in the magnetization state of the anchoring layer on the recording layer; therefore, variation in current required for changing the magnetization direction of the recording layer, that is, write current is suppressed. As a result, a magnetic storage device stable in write characteristic can be obtained.

BRIEF DESCRIPTION OF THE DRAWINGS

FIG. 6 is an explanatory drawing of the two-dimensional position of a magnetic storage element in the first embodiment of the invention, illustrating the magnetic storage element seen through;

DETAILED DESCRIPTION OF THE PREFERRED EMBODIMENTS

Hereafter, description will be given to embodiments of the invention with reference to the drawings.

First Embodiment

Circuitry and Structure of Memory Cells

Figure 1:
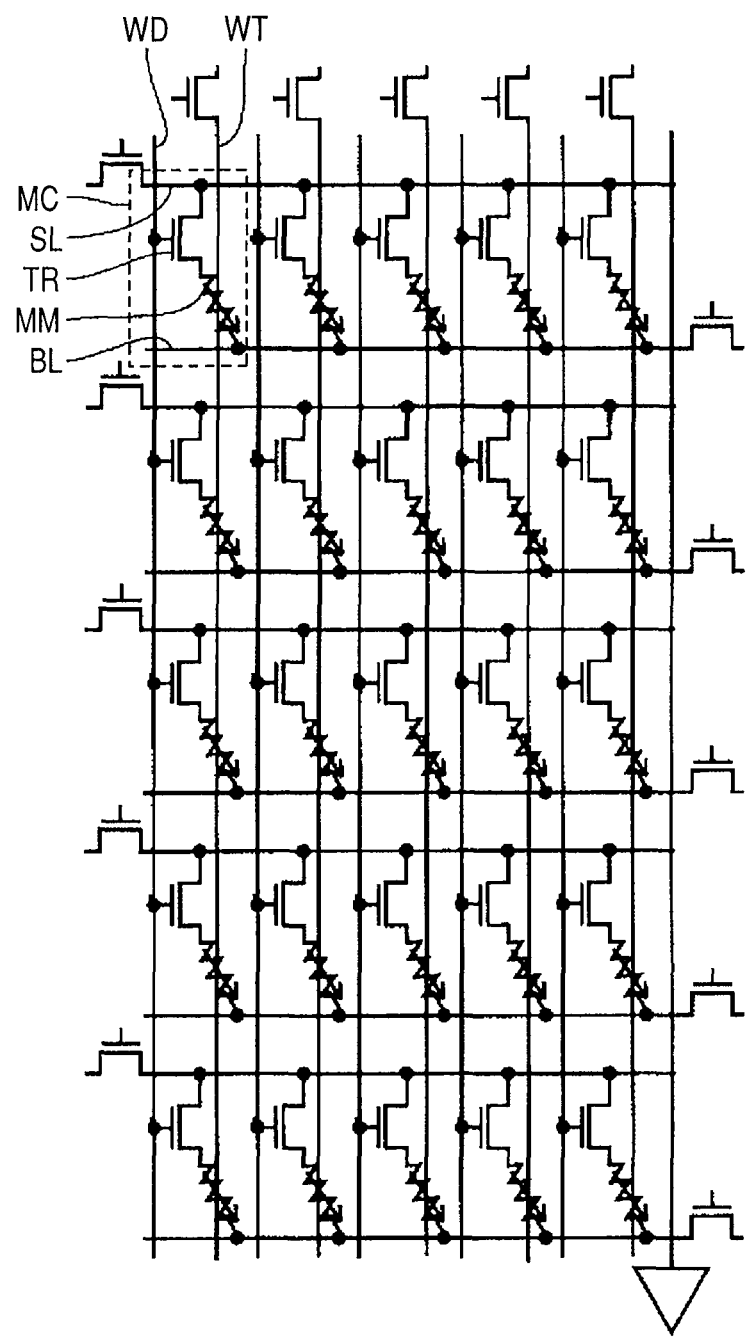
FIG. 1 is a circuit diagram of memory cells of a magnetic storage device in a first embodiment of the invention.

First, description will be given to the circuitry of memory cells of a magnetic storage device in the first embodiment of the invention. FIG. 1 is a circuit diagram of memory cells of the magnetic storage device in the first embodiment of the invention.

In the magnetic storage device, as illustrated in FIG. 1, one memory cell MC (in dotted frame) is comprised of an element selection transistor TR and a magnetic storage element (ferromagnetic tunnel junction element) MM. Multiple memory cells MC are formed in a matrix pattern.

A write line WT and a bit line BL for rewriting and reading information cross this magnetic storage element MM. A bit line BL is electrically coupled to one end of each of magnetic storage elements MM arranged in juxtaposition in one direction (for example, in rows).

The write lines WT are so arranged that a magnetic field can be applied to each of magnetic storage elements MM arranged in juxtaposition in the other direction (for example, in columns). The other end of the magnetic storage element MM is electrically coupled with the drain of the element selection transistor TR. The respective sources of element selection transistors TR arranged in juxtaposition in the one direction are electrically coupled together through source lines SL. The respective gates of element selection transistors TR arranged in juxtaposition in the other direction are electrically coupled together through word lines WD.

Figure 2:
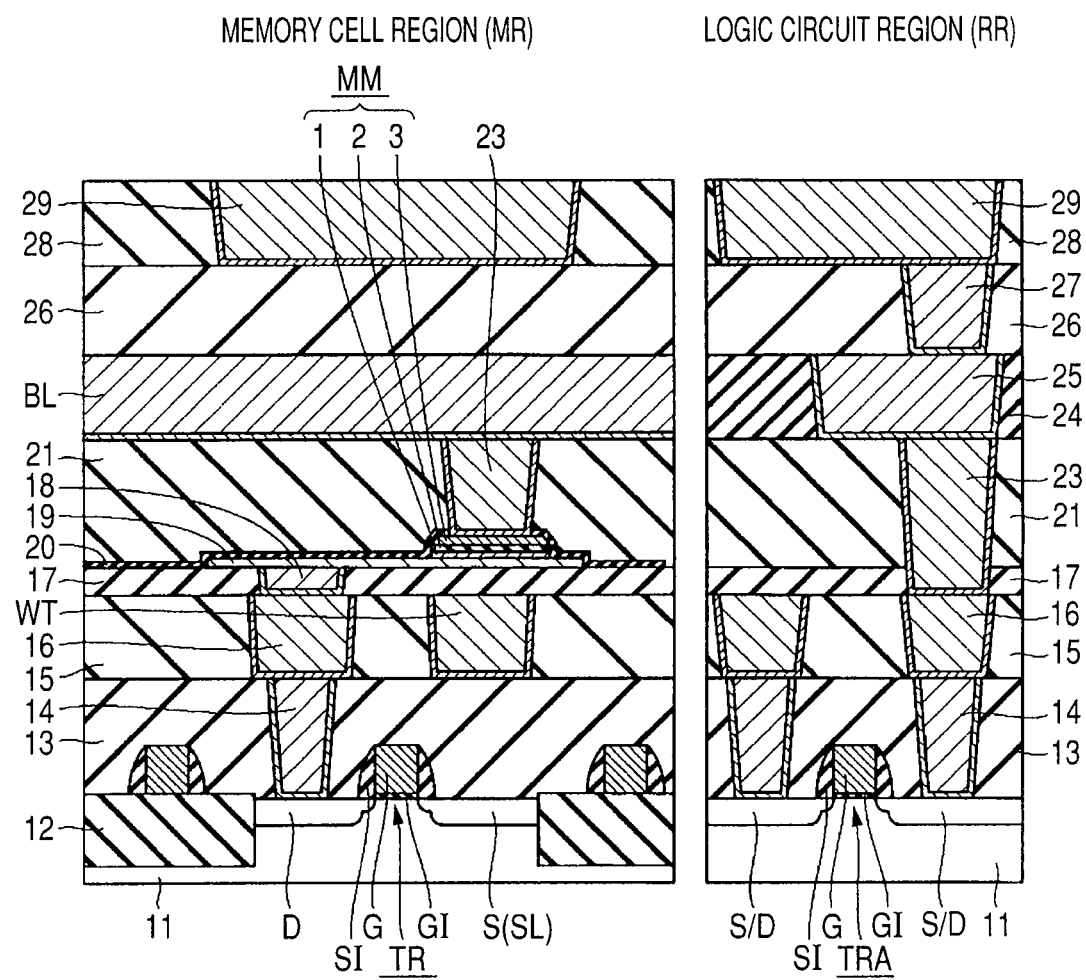
FIG. 2 is a schematic sectional view illustrating the configuration of a magnetic storage device in the first embodiment of the invention.

Description will be given to the structure of a magnetic storage device in this embodiment. Description will be given to the structure of this embodiment. FIG. 2 is a schematic sectional view illustrating the configuration of a magnetic storage device in the first embodiment of the invention.

As illustrated in FIG. 2, an element selection transistor TR is formed over the surface (the surface of a semiconductor substrate 11) of an element formation region defined by an element isolation insulating film 12 in the memory cell region MR of the semiconductor substrate 11. The element selection transistor TR mainly includes a drain region D, a source region S, and a gate electrode G. The drain region D and the source region S are formed over the surface of the semiconductor substrate 11 with a predetermined distance in-between. The drain region D and the source region S are each formed of an impurity region of predetermined conductivity type. The gate electrode G is formed over the area sandwiched between the drain region D and the source region S with a gate insulating film GI placed between it and the area. The side wall of the gate electrode G is covered with a side wall-like side wall insulating film SI.

An interlayer insulating film 13 is so formed that it covers the element selection transistor TR. This interlayer insulating film 13 is provided with a hole extended from its upper face to the drain region D. A coupling member 14 is formed in this hole. An interlayer insulating film 15 is formed over the interlayer insulating film 13. In this interlayer insulating film 15, there are formed a hole extended from its upper face to the coupling member 14 and a hole extended to the interlayer insulating film 13. In these holes, a write line WT and a wiring layer 16 are respectively formed. The wiring layer 16 is electrically coupled with the drain region D through the coupling member 14.

An interlayer insulating film 17 is formed over the interlayer insulating film 13 so that it covers the write line WT and the wiring layer 16. This interlayer insulating film 17 is provided with a hole extended form its upper face to the wiring layer 16. In this hole, a coupling member 18 is formed. Over the interlayer insulating film 17, a conductive layer 19 and a magnetic storage element MM are formed. This conductive layer 19 is electrically coupled with the drain region D through the coupling member 18, wiring layer 16, and coupling member 14.

The magnetic storage element MM is an magnetoresistance effect element and includes an anchoring layer 1, a tunnel insulating layer 2 (first nonmagnetic film) as a nonmagnetic layer, and a recording layer 3 which are laminated from beneath in this order. The anchoring layer 1 is so formed that it is in contact with the conductive layer 19.

A protective film 20 is so formed that it covers the magnetic storage element MM and an interlayer insulating film 21 is formed over this protective film 20. The protective film 20 and the interlayer insulating film 21 are provided with a hole that penetrate these films 20, 21 and is extended to the recording layer 3. In this hole, a coupling member 23 is formed. A bit line BL is formed over the interlayer insulating film 21. This bit line BL is electrically coupled to the magnetic storage element MM through the coupling member 23.

An interlayer insulating film 26 is so formed that it covers the bit line BL. Over the interlayer insulating film 21, a predetermined wiring layer 29 and an insulating film 28 are formed.

In the peripheral (logic) circuit region RR of the semiconductor substrate 11, a transistor TRA comprising a logic circuit is formed. This transistor TRA includes: a pair of source/drain regions S/D formed over the surface of the semiconductor substrate 11 with a predetermined distance in-between; and a gate electrode G formed over the area sandwiched between the source/drain regions S/D with a gate insulating film GI between it and the area. The side wall of the gate electrode G is covered with a side wall-like side wall insulating film SI.

Over this transistor TRA, there are formed predetermined wiring layers 16, 25, 29, coupling members 14, 23, 27 for electrically coupling the respective wiring layers 16, 25, 29, and interlayer insulating films 13, 15, 17, 21, 24, 26, 28.

More detailed description will be given to the structure of the memory cell.

Figure 3:
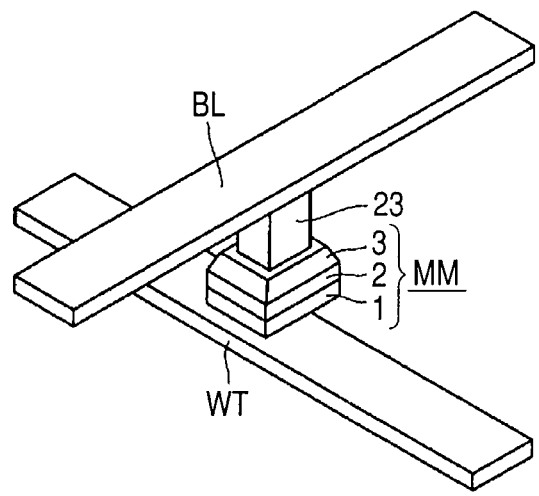
FIG. 3 is a perspective view schematically illustrating the configuration of the vicinity of a magnetic storage element of a magnetic storage device in the first embodiment of the invention.
Figure 4:
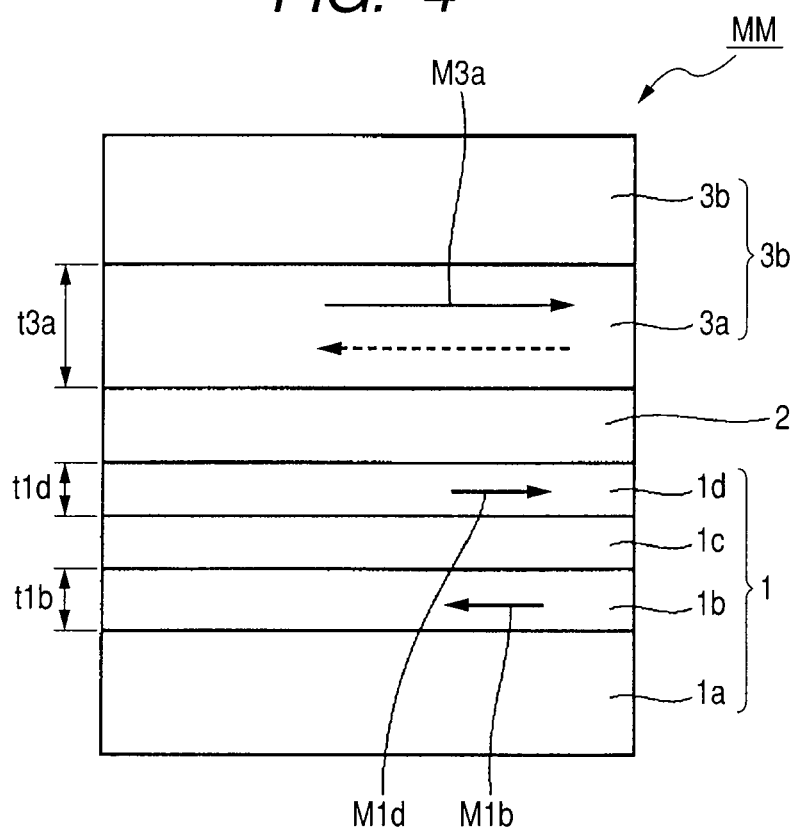
FIG. 4 is a sectional view schematically illustrating the configuration of a magnetic storage element of a magnetic storage device in the first embodiment of the invention.

FIG. 3 is a perspective view schematically illustrating the configuration of the vicinity of a magnetic storage element of a magnetic storage device in the first embodiment of the invention. FIG. 4 is a sectional view illustrating the configuration of a magnetic storage element in the first embodiment of the invention.

In the magnetic storage element MM where magnetization as information is carried out, as illustrated in FIG. 3 and FIG. 4, the following measure is taken: the magnetic storage element is arranged in an area where a write line WT and a bit line BL (first wiring and second wiring) cross each other with a gap in-between so that at least part thereof is sandwiched by the write line WT and the bit line BL from above and below. The magnetic storage element MM is of a laminated structure comprised of, for example, the anchoring layer 1, tunnel insulating layer 2, and recording layer 3.

As illustrated in FIG. 4, the anchoring layer 1 is so structured that the following films are laminated in the following order: an antiferromagnetic film 1a for fixing the anchoring layer; a ferromagnetic film 1b (second ferromagnetic film); a nonmagnetic film 1c (second nonmagnetic film); and a ferromagnetic film 1d (first ferromagnetic film). The direction of magnetization of the ferromagnetic film 1b is fixed by the antiferromagnetic film 1a. The magnetizations of the ferromagnetic films 1b and 1d are coupled in antiparallel with the nonmagnetic film 1c in-between and their respective magnetizations substantially cancel out each other.

A nonmagnetic metal film 3b is formed over the ferromagnetic film 3a (third ferromagnetic film) comprising the recording layer 3. The magnetization direction of the recording layer 3 is varied by a magnetic field generated by a current passed through a predetermined wiring (for example, a bit line BL) or injection of spin-polarized electrons.

Here, it will be set that: the magnetizations per unit area of the ferromagnetic films 1b and 1d of the anchoring layer 1 in this embodiment are respectively M1b and M1d and their thicknesses are respectively t1b and t2d; and the magnetization and thickness of the ferromagnetic film 3a of the recording layer 3 are respectively M3a and t3a. At this time, the following expression holds:

$$M3a \cdot t3a > M1b \cdot t1b + M1d \cdot t1d \tag{1}$$

As illustrated in FIG. 2, the anchoring layer 1 of the magnetic storage element MM is electrically coupled to the drain region D of the element selection transistor TR through the conductive layer 19, coupling member 18, wiring layer 16, and coupling member 14. Meanwhile, the recording layer 3 side of the magnetic storage element MM is electrically coupled to the bit line BL through the coupling member 23.

The direction of magnetization of the recording layer 3 is varied by a synthetic magnetic field of a magnetic field arising from the first wiring and a magnetic field arising from the second wiring. In general, such a recording layer has a direction in which magnetization is prone to occur depending on crystal structure, shape, or the like. Energy is low in this direction and the direction in which magnetization is prone to occur is designated as easy axis of magnetization (Ea: Easy-axis). Meanwhile, the direction in which magnetization is less prone to occur is designated as hard axis of magnetization (Ha: Hard-axis).

Figure 5:
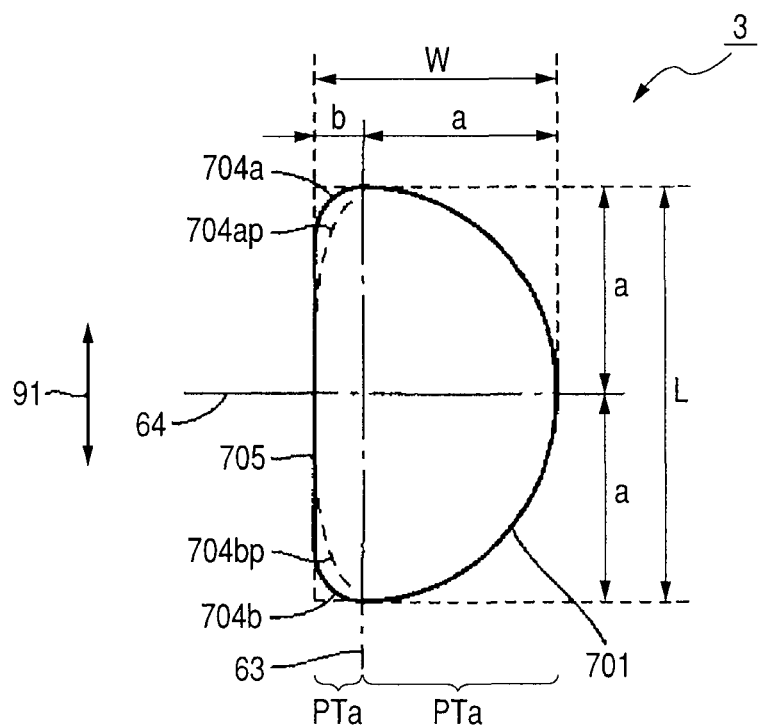
FIG. 5 is a plan view schematically illustrating the planar shape of a recording layer of a magnetic storage device in the first embodiment of the invention.

FIG. 5 is a plan view schematically illustrating the planar shape of a recording layer of a magnetic storage device in the first embodiment of the invention.

As illustrated in FIG. 5, the recording layer 3 has the maximum length L in the direction of the easy axis of magnetization on a first straight line 63 along the easy axis of magnetization 91. The recording layer 3 exists on the first straight line 63 throughout the length L. The recording layer 3 lies throughout a length W shorter than the maximum length L in the direction perpendicular to the easy axis of magnetization 91, that is, in the direction of the hard axis of magnetization.

The recording layer 3 has respectively a first part PTa and a second part PTb on one side (right side in the drawing) of the first straight line 63 and on the other side (left side in the drawing). The first part PTa lies throughout a length of a in the direction perpendicular to the easy axis of magnetization 91. The second part PTb lies throughout a length of b in the direction perpendicular to the easy axis of magnetization. The length b is shorter than the length a. The outer edge of the first part PTa is comprised only of a smooth curve convex outward of the outer edge.

The "outer edge of the first part PTa" refers to a part of the outer edge of the recording layer 3 contained in the first part PTa.

The planar shape of the first part PTa is an arc 701 and in this example, L/2=a. The second part PTb has a straight portion 705. The straight portion 705 is coupled to one side of each of curved portions 704a and 704b having an identical curvature at its upper and lower parts. The other side of each of the curved portions 704a and 704b is coupled to the arc 701.

The recording layer 3 has respectively a first part PTa and a second part PTb on one side (right side in the drawing) of the first straight line 63 and on the other side (left side in the drawing). The first part PTa lies throughout a length of a in the direction perpendicular to the easy axis of magnetization 91. The second part PTb lies throughout a length of b in the direction perpendicular to the easy axis of magnetization. The length b is shorter than the length a. The outer edge of the first part PTa is comprised only of a smooth curve convex outward of the outer edge.

The "outer edge of the first part PTa" refers to a part of the outer edge of the recording layer 3 contained in the first part PTa.

Preferably, the axis of symmetry of the first part PTa is identical with the second straight line 64.

FIG. 5 illustrates a case where the curved portions 704a and 704b has an identical curvature. However, their curvatures need not be identical. That is, the second part PTb may be asymmetrical with respect to the second straight line 64.

In the above description of this embodiment, the anchoring layer 1 and the tunnel insulating layer 2 also have the planar shape illustrated in FIG. 5. The tunnel insulating layer 2 and the anchoring layer 1 may be identical in planar shape with the recording layer 3. Alternatively, they may have any planar shape so larger in area than that of the recording layer 3 that the planar shape of the recording layer 3 is embraced therein.

Figure 6:
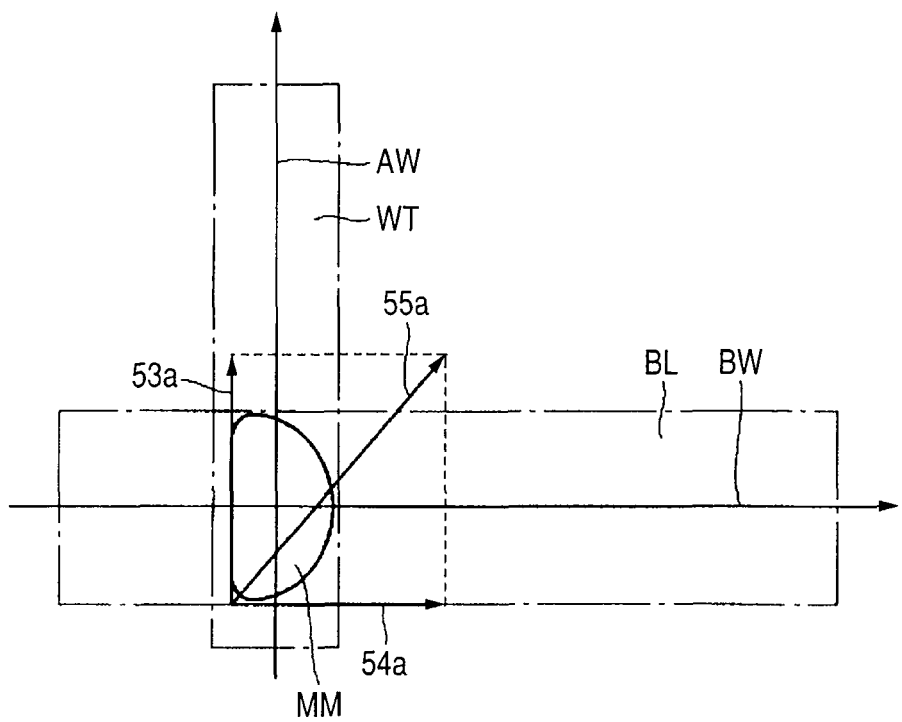

FIG. 6 is an explanatory drawing of the two-dimensional position of a magnetic storage element MM in the first embodiment of the invention. The drawing illustrates the magnetic storage element seen through. When a first axis AW is taken as central axis, as illustrated mainly in FIG. 6, a write line WT has a portion extended along this axis. When a second axis BW is taken as central axis, a bit line BL has a portion extended along this axis. The magnetic storage element MM is so arranged that the easy axis of magnetization 91 (FIG. 5) is substantially in parallel with the first axis AW. That is, the magnetic storage element MM is so arranged that the direction of its length is substantially in parallel with the direction of extension of the write line WT. In addition, the magnetic storage element MM is so arranged that the direction of its hard axis of magnetization is substantially in parallel with the second axis BW. In this embodiment, the write lines WT and the bit lines BL are so formed that the directions of their extension are substantially perpendicular to each other.

(Operation of Memory Cells)

Description will be given to the operation of memory cells.

Description will be given with reference to FIG. 2. Read operation is carried out by passing a predetermined current through the magnetic storage element MM of a specific memory cell and detecting a difference in resistance value depending on the direction of magnetization. First, the selection transistor TR of the specific memory cell is turned on. Then a predetermined sense signal is transmitted from the bit line BL to the source line SL through the coupling member 18, wiring layer 16, coupling member 14, and selection transistor TR by way of the specific magnetic storage element MM.

At the time, the following take place on a case-by-case basis: when the directions of magnetization of the recording layer 3 and the anchoring layer 1 in the magnetic storage element MM are identical (parallel), the resistance value is relatively low; and when the directions of magnetization of the recording layer and the anchoring layer 1 are opposite to each other (antiparallel), the resistance value is relatively high. The tunnel magnetoresistance effect element has such a characteristic that: when the respective magnetization directions of the recording layer 3 and the anchoring layer 1 are parallel, its resistance value is small; and when the respective magnetization directions of the recording layer 3 and the anchoring layer 1 are antiparallel, its resistance value is large.

As a result, when the direction of magnetization of the magnetic storage element MM is parallel, the intensity of a sense signal passed through the source line SL is higher than the signal intensity of the reference memory cell. When the direction of magnetization of the magnetic storage element MM is antiparallel, meanwhile, the intensity of a sense signal is lower than the signal intensity of the reference memory cell. Thus, whether information written to a specific memory cell is "0" or "1" is determined based on whether the intensity of a sense signal is higher or lower than the signal intensity of a predetermined reference memory cell.

Write (rewrite) operation is carried out by passing a predetermined current through a bit line BL and a write line WT and magnetizing (reversely magnetizing) a magnetic storage element MM. First, as the result of a current being passed through the selected bit line BL and write line WT, a magnetic field (arrows 53a and 54a in FIG. 6) corresponding to the direction of current passage is respectively produced around the bit line BL and the write line WT. It turns out that the following synthetic magnetic field acts on the magnetic storage element MM positioned in the area where the selected bit line BL and write line WT cross each other: a synthetic magnetic field (arrow 55a in FIG. 6) of a magnetic field produced by the current passed through the bit line BL and a magnetic field produced by the current passed through the write line WT.

At this time, magnetization is carried out by the synthetic magnetic field in either of the following modes: a mode in which the recording layer 3 of the magnetic storage element MM is magnetized in the same direction as the direction of magnetization of the anchoring layer 1 and a mode in which the recording layer 3 is magnetized in the direction opposite the direction of magnetization of the anchoring layer 1. Thus, cases where the directions of magnetization of the recording layer 3 and the anchoring layer 1 are identical (parallel) and cases where they are opposite (antiparallel) are implemented and these directions of magnetization are recorded as information corresponding to "0" or "1."

(Manufacturing Method for Magnetic Storage Device)

Description will be given to an example of a manufacturing method for the above-mentioned magnetic storage element and magnetic storage device.

Figure 7:
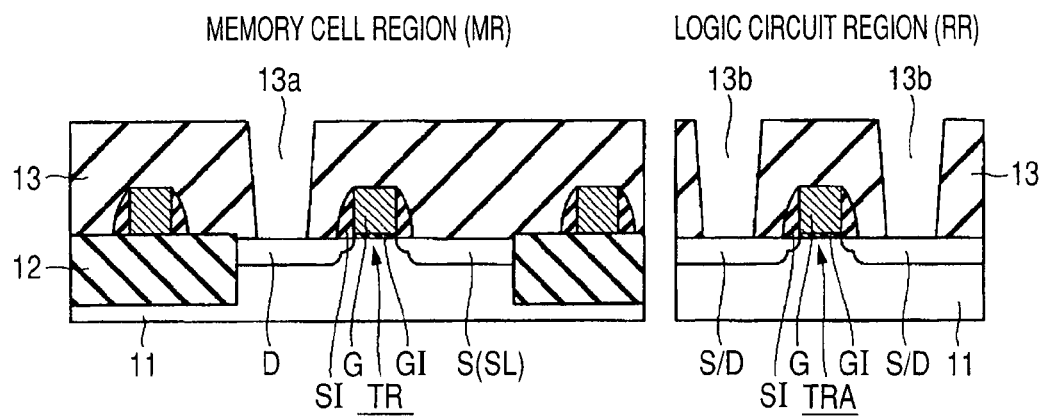
FIG. 7 is a schematic sectional view illustrating a first step in a manufacturing method for a magnetic storage device in the first embodiment of the invention.

The drawings from FIG. 7 to FIG. 11 are schematic sectional views illustrating a manufacturing method for the magnetic storage device in the first embodiment of the invention on a step-by-step basis. As illustrated in FIG. 7, first, an element isolation insulating film 12 is formed in a predetermined area in the principal surface of the semiconductor substrate 11 to form a memory cell region MR and a peripheral circuit region RR. A gate electrode G is formed over the surface of the semiconductor substrate 11 positioned in the memory cell region MR and the peripheral circuit region RR with a gate insulating film GI between it and the surface. An impurity of predetermined conductivity type is implanted into the surface of the semiconductor substrate 11 with these gate electrodes G and the like used as a mask. As a result, a drain region D and a source region S comprised of an impurity region and a pair of source/drain regions S/D are formed. Thus, an element selection transistor TR containing the gate electrode G, drain region D, and source region S is formed in the memory cell region MR and a transistor TRA comprising a logic circuit is formed in the peripheral circuit region RR.

An interlayer insulating film 13 is so formed that it covers the element selection transistor TR and the transistor TRA by, for example, a CVD (Chemical Vapor Deposition) method. The interlayer insulating film 13 is subjected to a predetermined photoengraving process and etching to form contact holes 13a, 13b that expose the surface of the semiconductor substrate 11. For example, a tungsten layer (not shown) is formed over the interlayer insulating film 13 so that the contact holes 13a, 13b are filled therewith. The tungsten layer is subjected to CMP (Chemical Mechanical Polishing) to remove a portion of the tungsten layer positioned over the upper face of the interlayer insulating film 13.

Figure 8:
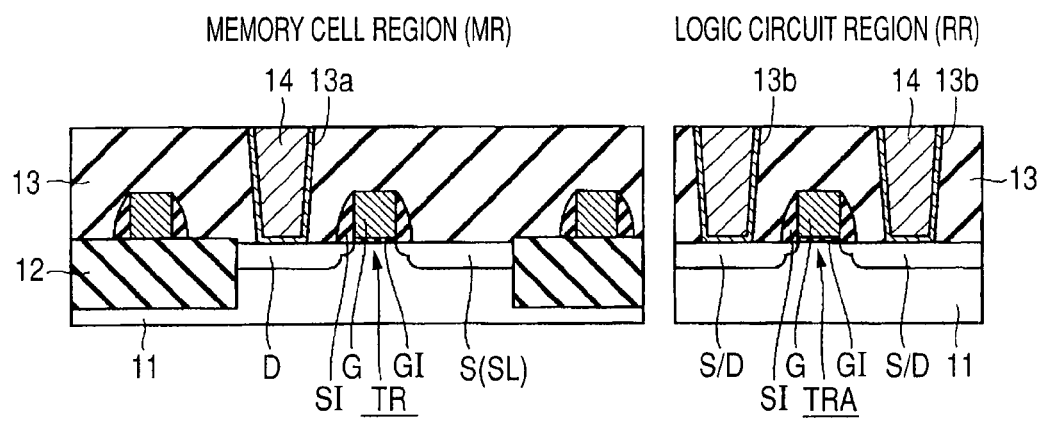
FIG. 8 is a schematic sectional view illustrating a second step in the manufacturing method for a magnetic storage device in the first embodiment of the invention.

As the result of the removal of the tungsten layer, as illustrated in FIG. 8, the tungsten layer is left in each contact hole 13a, 13b and a coupling member 14 is formed there.

Figure 9:
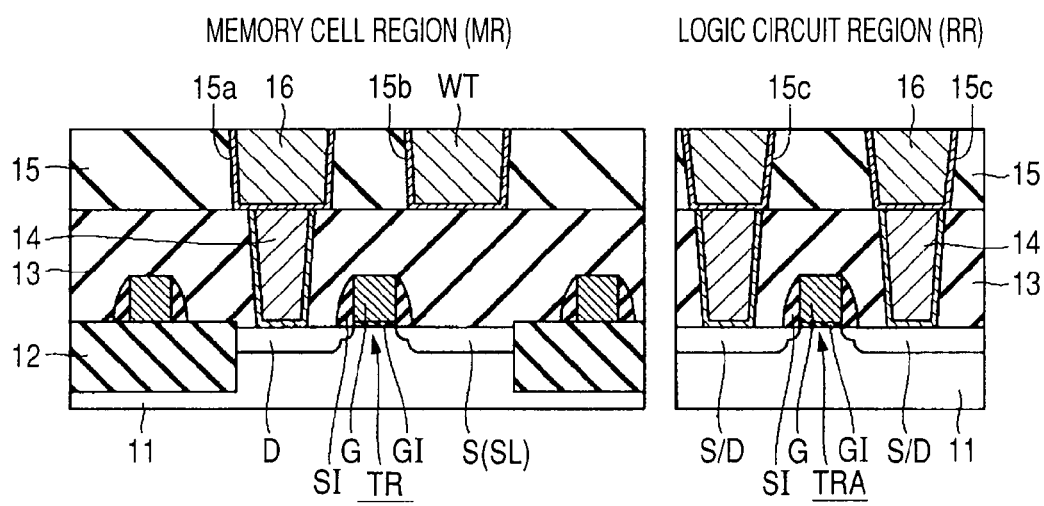
FIG. 9 is a schematic sectional view illustrating a third step in the manufacturing method for a magnetic storage device in the first embodiment of the invention.
Figure 10:
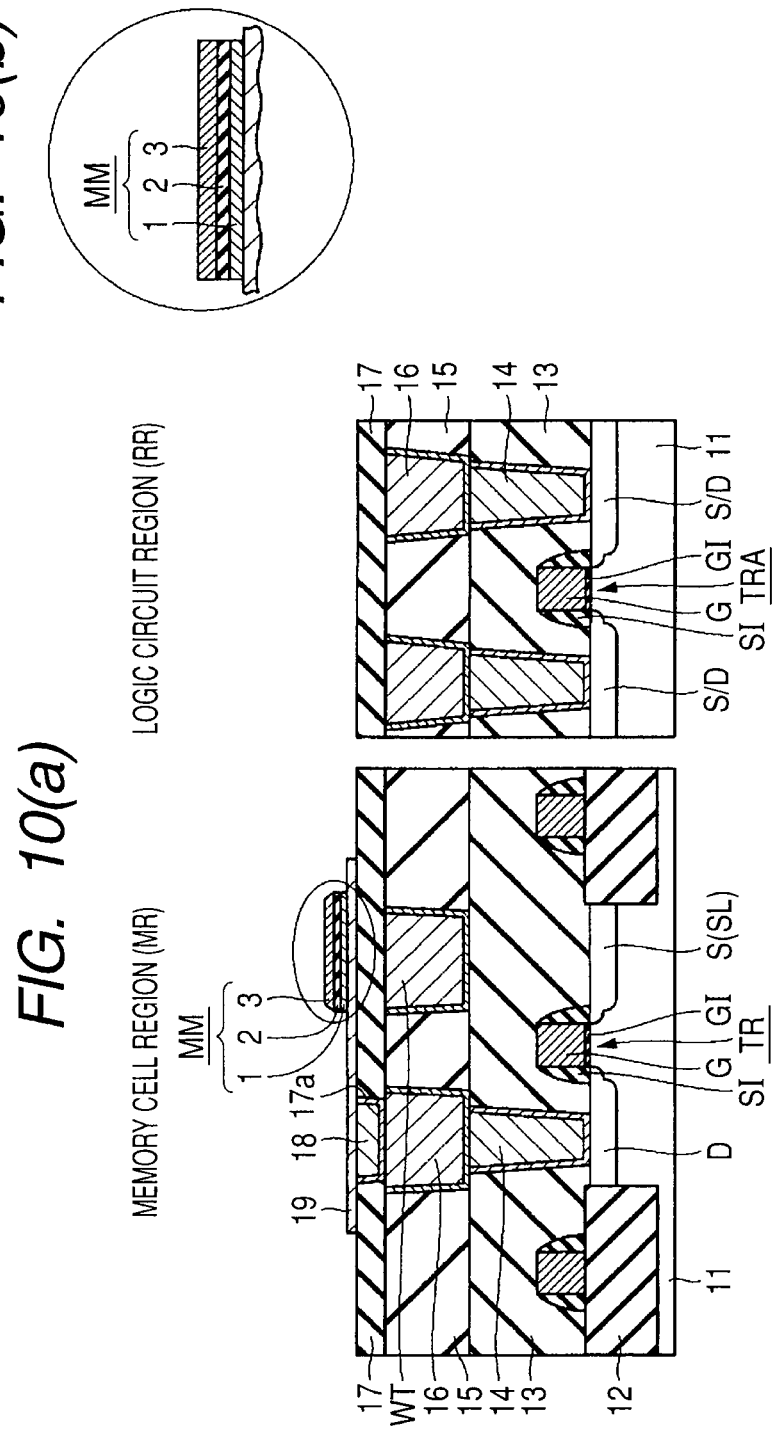
FIG. 10(a) is a schematic sectional view illustrating a fourth step in the manufacturing method for a magnetic storage device in the first embodiment of the invention.
FIG. 10(b) is an enlarged sectional view illustrating a magnetic storage element portion in an enlarged manner.

As illustrated in FIG. 9, an interlayer insulating film 15 is formed over the interlayer insulating film 13 by, for example, a CVD method. The interlayer insulating film 15 is subjected to a predetermined photoengraving process and etching to form openings 15a, 15b in the memory cell region MR for forming a write line and a predetermined wiring layer. In the peripheral circuit region RR, an opening 15c for forming a predetermined wiring layer is formed in the interlayer insulating film 15. For example, a copper layer (not shown) is formed over the interlayer insulating film 15 so that the openings 15a, 15b, 15c are filled therewith. The copper layer is subjected to CMP to remove the copper layer positioned over the upper face of the interlayer insulating film 15 and leave the copper layer in the openings 15a, 15b, 15c. In the memory cell region MR, as a result, a write line WT is formed in the opening 15a and a wiring layer 16 is formed in the opening 15b. In the peripheral circuit region RR, a wiring layer 16 is formed in the opening 15c.

When the copper layer is formed to fill the openings 15a, 15b, 15c, a reaction prevention layer may be laminated to prevent reaction between the copper layer and the interlayer insulating film. When the write lines WT are formed, the copper layer may be laminated with a high-permeability film to concentrate the wiring current magnetic field on a predetermined magnetic storage element.

As illustrated in FIGS. 10(a) and 10(b), an interlayer insulating film 17 is formed over the interlayer insulating film 15 by, for example, a CVD method. The interlayer insulating film 17 is subjected to a predetermined photoengraving process and etching to form a contact hole 17a that exposes the surface of the wiring layer 16. For example, a copper layer (not shown) is formed over the interlayer insulating film 17 so that the contact hole 17a is filled therewith. The copper layer is subjected to, for example, CMP or the like to remove the copper layer positioned over the upper face of the interlayer insulating film 17 and leave the copper layer in the contact hole 17a. Thus a coupling member 18 is formed.

Subsequently, as illustrated in FIGS. 10(a) and 10(b), a conductive layer 19 and a magnetic storage element MM are formed over the interlayer insulating film 17 in the memory cell region MR. This magnetic storage element MM is comprised of a laminated film of an anchoring layer 1, a tunnel insulating layer 2, and a recording layer 3.

First, an antiferromagnetic film 1a (antiferromagnetic layer), a ferromagnetic film 1b (ferromagnetic layer), a nonmagnetic film 1c, and a ferromagnetic film 1d (ferromagnetic layer) are formed in this order as the anchoring layer 1. The antiferromagnetic film 1a, ferromagnetic film 1b, nonmagnetic film 1c, and ferromagnetic film 1d are respectively, for example, a platinum manganese film with a film thickness of approximately 20 nm, a cobalt alloy film with a film thickness of 1.4 nm, a ruthenium film with a film thickness of 0.7 nm, and a cobalt alloy film with a film thickness of 1.6 nm. The magnetizations per unit volume of the two cobalt alloy films are both 1,100,000 A/m (1100 emu/cm$^3$) and they are magnetized in the antiparallel directions with the nonmagnetic film in-between as mentioned above. The foregoing satisfies Expression (1) above.

Next, the tunnel insulating layer 2 is formed. The tunnel insulating layer 2 is, for example, an aluminum oxide film with a film thickness of approximately 1 nm.

Next, a ferromagnetic film 3a and a nonmagnetic metal film 3b are formed as the recording layer 3. The ferromagnetic film 3a and the nonmagnetic metal film 3b are respectively, for example, a nickel alloy film with a film thickness of approximately 5 nm and a tantalum film with a film thickness of 50 nm. The magnetization per unit volume of the nickel alloy film is 800,000 A/m (800 emu/cm$^3$).

The platinum manganese film, cobalt alloy films, ruthenium film, aluminum oxide film, nickel alloy film, and tantalum film are formed by, for example, sputtering.

Thereafter, the nickel alloy film, aluminum oxide film, cobalt alloy film, ruthenium film, cobalt alloy film, and platinum manganese film are subjected to a predetermined photoengraving process and etching. As a result, a magnetic storage element MM in a predetermined shape having the anchoring layer 1, tunnel insulating layer 2, and recording layer 3 is formed. In general, a gas having oxygen as the main component is used when a dry process (ashing) is used to remove a resist pattern after etching. Preferably, a gas that does not oxidize the constituent materials of the anchoring layer 1 and the recording layer 3, for example, hydrogen, nitrogen, ammonia, and a mixed gas of them are used to suppress oxidation of the anchoring layer 1 and the recording layer 3.

Figure 11:
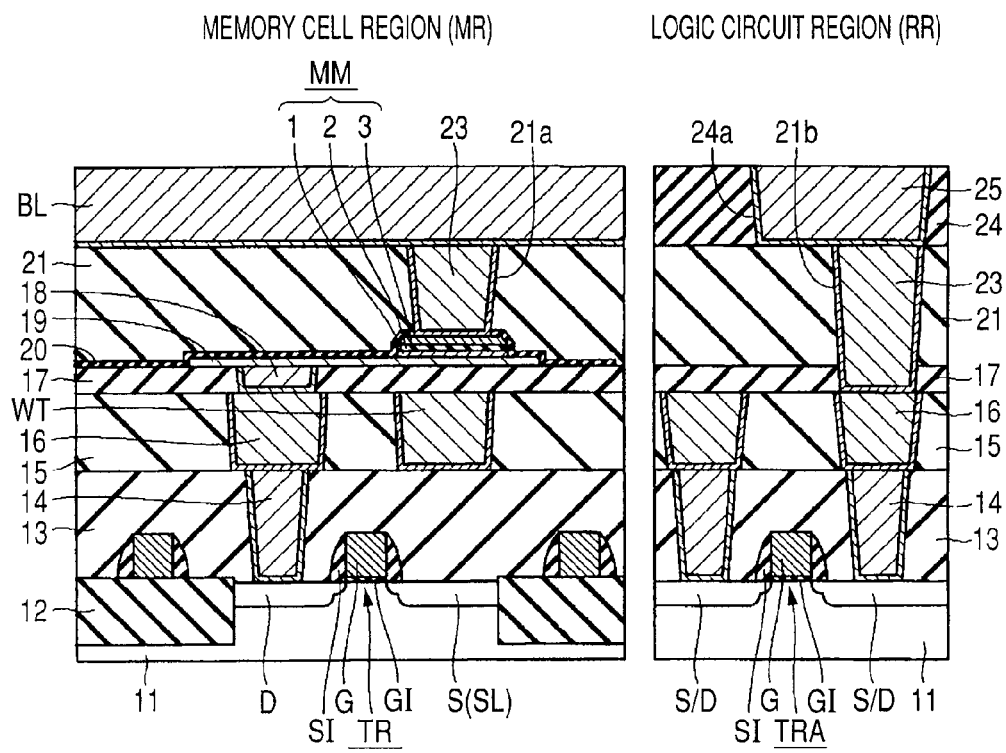
FIG. 11 is a schematic sectional view illustrating a fifth step in the manufacturing method for a magnetic storage device in the first embodiment of the invention.

As illustrated in FIG. 11, a protective film 20 is so formed that it covers the magnetic storage element MM for the prevention of the magnetic storage element MM from being damaged by subsequent processes. Further, an interlayer insulating film 21 is formed over the interlayer insulating film 17 by, for example, a CVD method so that it covers the protective film 20.

In the memory cell region MR, the interlayer insulating film 21 and the protective film 20 are subjected to a predetermined photoengraving process and etching to form a contact hole 21a that exposes the surface of the recording layer 3. In the peripheral circuit region RR, the interlayer insulating film 21 and the interlayer insulating film 17 are subjected to a predetermined photoengraving process and etching to form a contact hole 21b extended to the surface of the wiring layer 16. For example, a copper layer (not shown) is formed over the interlayer insulating film 21 so that the contact holes 21a, 21b are filled therewith. This copper layer is subjected to, for example, CMP or the like to remove the copper layer positioned over the upper face of the interlayer insulating film 21 and leave the copper layer in each contact hole 21a, 21b. Thus coupling members 23 are formed.

An interlayer insulating film 24 is formed over the interlayer insulating film 21 by, for example, a CVD method so that it covers the interlayer insulating film 21. This interlayer insulating film 24 is subjected to a predetermined photoengraving process and etching. As a result, an opening for forming a bit line is formed in the interlayer insulating film 24 in the memory cell region MR and an opening 24a is formed in the interlayer insulating film 24 in the peripheral circuit region RR. For example, a copper layer (not shown) is formed over the interlayer insulating film 24 so that these openings are filled therewith. This copper layer is subjected to, for example, CMP or the like to remove the copper layer positioned over the upper face of the interlayer insulating film 24. Further, the copper layer is left in the opening for bit line to form a bit line BL there and the copper layer is left in the opening 24a to form a wiring layer 25 there.

In the above description, a case where a single damascene process is adopted has been taken as an example. Instead, the following procedure may be taken: after the formation of the interlayer insulating film 21, the interlayer insulating film 24 is formed; and then predetermined coupling members and wiring layer are formed in these interlayer insulating films 21, 24 by a dual damascene process. In this case, first, the interlayer insulating film 24 is subjected to a predetermined photoengraving process and etching to form the opening (not shown) for forming a bit line in the memory cell region MR. In the peripheral circuit region RR, the opening 24a for forming a wiring layer is formed. Subsequently, the interlayer insulating film 21 is subjected to a predetermined photoengraving process and etching. As a result, the contact hole 21a extended to the surface of the recording layer 3 of the magnetic storage element MM is formed in the memory cell region MR. The contact hole 21b extended to the surface of the wiring layer 16 is formed in the peripheral circuit region RR. After the contact holes are formed in the interlayer insulating films 21, 24, the opening 24a and the like may be formed in the interlayer insulating film 24.

Subsequently, for example, a copper layer (not shown) is formed over the interlayer insulating film 24 so that the contact holes 21a, 21b, opening 24a, and the like are filled therewith. This copper layer is subjected to, for example, CMP or the like to remove the portion of the copper layer positioned over the upper face of the interlayer insulating film 24. In the memory cell region MR, as a result, the coupling member 23 that fills the contact hole 21a and is electrically coupled to the recording layer 3 is formed. At the same time, a bit line BL electrically coupled to the coupling member 23 is formed in the opening. If the coupling member 23 is not used, there is no problem as long as the bit line BL and the recording layer 3 are electrically coupled with each other. In the peripheral circuit region RR, meanwhile, the coupling member 23 electrically coupled to the wiring layer 16 is formed in the contact hole 21b and the wiring layer 25 electrically coupled to the coupling member 23 is formed in the opening 24a.

As illustrated in FIG. 2, an interlayer insulating film 26 is formed over the interlayer insulating film 24 so that it covers the bit line BL and wiring layer 25 formed by the above-mentioned method. In the peripheral circuit region RR, a hole is formed in the interlayer insulating film 26 and a coupling member 27 is formed in this hole. Further, an interlayer insulating film 28 is formed over the interlayer insulating film 26. An opening is formed in this interlayer insulating film 28 and a wiring layer 29 is formed in the opening.

In the above description, a case where a single damascene process is used has been taken as an example. Instead, the following procedure may be taken: after the formation of the interlayer insulating film 26, the interlayer insulating film 28 is formed; and then the coupling member 27 and the wiring layer 29 are formed in these interlayer insulating films 26, 28 by a dual damascene process as mentioned above.

The magnetic storage device in this embodiment is manufactured as mentioned above.

In the description of the above manufacturing method for the magnetic storage device, a tungsten layer has been taken as an example of the coupling members 14 or the like. Instead, for example, silicon may be applied. Alternatively, metal, such as copper, titanium, or tantalum, may be applied. Further, an alloy of these metals, a nitride of these metals, and the like can also be applied. In the above description, CMP or RIE has been taken as an example of a method for forming the coupling members 14. Instead, for example, plating, sputtering, CVD, or the like may be applied. When copper is applied as metal, a so-called damascene process can be applied and a wiring layer can also be formed in parallel with the coupling members 14.

In the above description, a single damascene process has been taken as an example of a method for forming the write lines WT. When the write lines WT and the coupling members 14 are simultaneously formed, a dual damascene process can also be applied. When a metal, such as silicon, tungsten, aluminum, titanium, or the like, an alloy of these metals, or a compound of these metals is applied as wiring material, wirings can also be formed by dry etching.

The film thickness of the interlayer insulating film placed between a wiring layer and a wiring layer differs depending on the applied device. In the present magnetic storage device, this film thickness is, for example, approximately 40 nm.

In the above description, an oxide of aluminum has been taken as an example of the tunnel insulating layer 2 of the magnetic storage element MM. Nonmagnetic materials are desirable for the tunnel insulating layer 2. For example, the following materials are desirable for the tunnel insulating layer 2: an oxide of metal, such as aluminum, silicon, tantalum, magnesium, or the like, a nitride of the metal, an alloy oxide of the metal typified by silicate and the like, a nitride of that alloy, or the like. It is desirable that the tunnel insulating layer 2 should be formed as a relatively thin film with a film thickness of approximately 0.3 to 5 nm. When a nonmagnetic metal material is used in place of the tunnel insulating layer 2, the giant magnetoresistance effect perpendicular to a so-called film surface can also be utilized.

In the above description, a laminated structure of a platinum manganese alloy film and a cobalt iron alloy film has been taken as an example of the anchoring layer 1 of the magnetic storage element MM. Further, a nickel iron alloy film has been taken as an example of the recording layer 3. A ferromagnetic material having, for example, nickel, iron, and/or cobalt as the main component is desirable for the anchoring layer 1 and the recording layer 3. In addition, an additive of boron, nitrogen, silicon, molybdenum, or the like may be added to these ferromagnetic materials to enhance the magnetic characteristic of the ferromagnetic material and achieve thermal stability. Especially, the magnetic characteristic of the recording layer 3 can also be enhanced and stabilized by laminating the following films over the recording layer 3: a crystalline material thin film having a body-centered cubic, rutile, sodium chloride, or zinc blend crystal structure that improves the magnetic characteristic of the recording layer 3; and/or an oxidation preventive film of tantalum, ruthenium, or the like. Further, $NiMnSb$, $Co_2Mn(Ge,Si)$, $Co_2Fe(Al,Si)$, $(Zn,Mn)Fe_2O_4$, or the like called half metal can also be applied. In half metal, an energy gap exists in one spin band and thus a very large magnetic effect can be obtained. As a result, a large signal output can be obtained.

In the anchoring layer 1, the magnetization direction can be more firmly fixed by providing it with a laminated structure of an antiferromagnetic layer and a ferromagnetic layer. That is, the antiferromagnetic layer fixes the direction of the spin of the ferromagnetic layer and the direction of magnetization of the ferromagnetic layer is thereby kept constant. A compound of one of ferromagnetic materials, such as iron, or noble metals and manganese is desirable for the antiferromagnetic layer.

In the description of the above manufacturing method, a case where the anchoring layer 1, tunnel insulating layer 2, and recording layer 3 comprising this magnetic storage element are each formed by sputtering has been taken as an example. However, each of the anchoring layer 1, tunnel insulating layer 2, and recording layer 3 need not be formed by sputtering and can also be formed by, for example, an MBE (Molecular Beam Epitaxy) method, a chemical vapor phase growth method, an evaporation method, or the like.

In the description of the above manufacturing method for the magnetic storage device, a case where there is the conductive layer 19 between the anchoring layer 1 of the magnetic storage element MM and the coupling member 18 has been taken as an example. However, the anchoring layer 1 and the coupling member 18 may be directly coupled with each other. Such a structure that the wiring layer 16 and the conductive layer 19 are directly coupled with each other without the coupling member 18 in-between may be adopted. In this case, the conductive layer 19 may be formed in the same shape as the planar shape of the anchoring layer 1 so that it overlaps the anchoring layer 1 as viewed in a plane. It is desirable to apply a low-resistance material, for example, platinum, ruthenium, copper, aluminum, tantalum, or the like as the material of the conductive layer 19. It is desirable to take the following measure so that the flatness of the anchoring layer 1, tunnel insulating layer 2, and recording layer 3 formed over the conductive layer will not be impaired: the film thickness of the conductive layer 19 is set to, for example, 300 nm or below.

When the anchoring layer 1 is formed in the same size as that of the recording layer 3 as viewed in a plane, it is required to take the following measure so that the conductive layer 19 is coupled with the coupling member 14: the conductive layer 19 is so formed that it is larger than the anchoring layer 1 as viewed in a plane. Even though the conductive layer 19 is so formed that it is larger than anchoring layer 1 in a plane as mentioned above, it does not pose any problem on the magnetic storage element.

When the coupling member 18 is formed of, for example, copper, the following can be implemented by placing the predetermined conductive layer 19 between the interlayer insulating film 15 and the magnetic storage element MM: when the magnetic storage element MM is patterned by etching, the coupling member 18 of copper can be prevented from being corroded. Further, the following can be implemented by applying a material whose resistance is lower than the resistance of the anchoring layer 1 of the magnetic storage element MM to the conductive layer 19: when information is read, the resistance of the passage of current can be reduced and thus the readout speed can also be enhanced.

In the above description of the magnetic storage device in this embodiment, the following case has been taken as an example: a case where the protective film 20 is so formed that it covers the magnetic storage element MM to prevent the magnetic storage element MM from being damaged at steps after the formation of the magnetic storage element MM. Examples of damage the magnetic storage element MM may sustain during the manufacturing process includes heat treatment that occurs when an interlayer insulating film is formed. When a silicon oxide film is formed as an interlayer insulating film, the silicon oxide film is formed in an oxidizing atmosphere at approximately 400° C.

At this time, there is a possibility that a magnetic film is oxidized in the oxidizing atmosphere and as a result, the magnetic characteristic of the magnetic storage element MM may be degraded. To cope with this, the magnetic storage element MM is covered with the protective film 20 of a silicon nitride film, an aluminum oxide film, or the like. As a result, the protective film 20 functions as a barrier against oxidation and the magnetic storage element MM can be thereby protected.

To prevent such oxidation, the interlayer insulating films may be provided with two-layer structure of a thin film, such as a silicon nitride film, that can be formed in a non-oxidizing atmosphere and an oxidizing insulating film. In this case, the silicon nitride film of the interlayer insulating film of two-layer structure functions as the protective film for the magnetic storage element MM.

Further, a film containing at least one of the following materials is desirable for the protective film 20: insulating metal nitride, insulating metal carbide, and metal oxide formed by oxidizing a metal lower in oxide generation free energy than Fe. Use of such a metal makes it possible to suppress the magnetic storage element MM from being oxidized during an oxidizing step in a manufacturing process for a magnetic storage device using a magnetic material thin film containing Fe. As a result, a magnetic storage device that is easy to manufacture and stable in operating characteristic can be obtained.

Hereafter, detailed description will be given to the relation between the write characteristic of a magnetic storage device and the planar shape of its recording layer 3.

Figure 12:
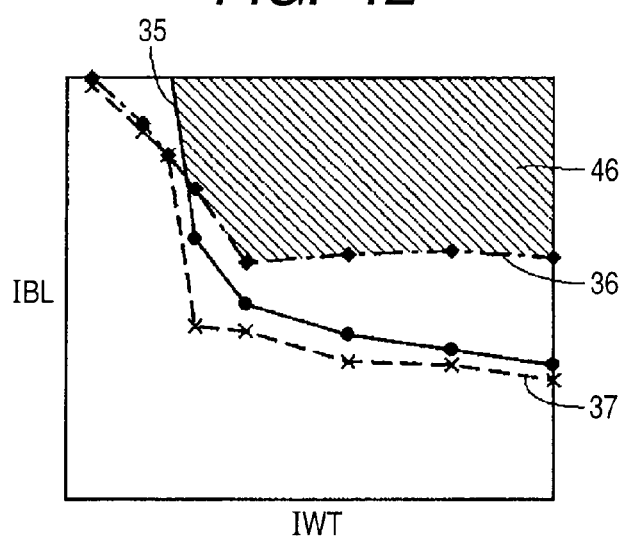
FIG. 12 is a drawing indicating asteroid curves of a magnetic storage device in the first embodiment of the invention.

FIG. 12 indicates asteroid curves of a magnetic storage device in the recording layer illustrated in FIG. 5. In FIG. 12, the horizontal axis indicates a current IWT passed through a write line WT to produce a magnetic field Hx in the direction of the hard axis of magnetization; and the vertical axis indicates a current IBL passed through a bit line BL to produce a magnetic field Hy in the direction of the easy axis of magnetization.

The measurement points plotted in the graph of FIG. 12 are results obtained by taking the following procedure: when the direction of magnetization of the recording layer 3 is equivalent to the negative direction of the magnetic field Hy, a constant write line current IWT is applied; and a bit line current IBL required for reversing the direction of magnetization is measured. The curves coupling the individual plots 35 to 37 indicate the asteroid curves of respective recording layers 3.

When a recording layer is in a shape including both the curved portions 704a and 704b indicated by solid lines in FIG. 5 and symmetric in the direction of hard axis of magnetization, the following takes place: the asteroid curve indicated as plot 35 in FIG. 12 is obtained. In cases where the recording layer 3 having the shape illustrated in FIG. 5 is adopted, the following takes place when the write line current IWT in plot 35 becomes smaller than a certain value as described later: the bit line current IBL required for magnetization reversal in the direction of easy axis of magnetization is drastically increased. (The above certain value will be hereafter referred to as "threshold value in the direction of hard axis of magnetization.") That is, a large bit line current is required for magnetization reversal only in the range in which the write line current IWT is smaller than the threshold value in the direction of hard axis of magnetization. Also when write operation is carried out in the opposite direction in this case, the sign of IBL is only reversed with respect to the write current though not shown here.

Figure 13:
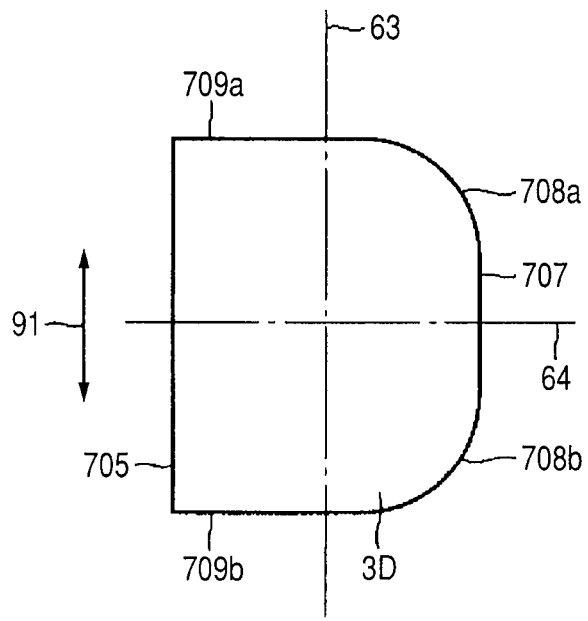
FIG. 13 is a plan view schematically illustrating the planar shape of a recording layer of a magnetic storage device in a first modification.

Description will be given to a modification for the purpose of explaining the reason why the above effect is obtained. FIG. 13 is a plan view schematically illustrating the planar shape of a recording layer of a magnetic storage device in a first modification.

As illustrated in FIG. 13, the recording layer 3D in this modification includes the following in its planar shape: linear straight portions 707, 705 in the direction of a first straight line 63 (the direction of easy axis of magnetization); and linear straight portions 709a, 709b in the direction of a second straight line 64 (the direction of an axis perpendicular to the easy axis of magnetization). The straight portion 705 and the straight portion 709b are so formed that they cross each other at a right angle. The straight portion 705 and the straight portion 709a are so formed that they cross each other at a right angle. Meanwhile, the straight portion 709a and the straight portion 707 are coupled with each other through a curved portion 708a and the straight portion 707 and the straight portion 709b are coupled with each other through a curved portion 708b. The straight portion 707 and the straight portion 705 are parallel to each other and the straight portion 709a and the straight portion 709b are parallel to each other. The curved portion 708a and the curved portion 708b are so formed that they respectively draw an arc. That is, the recording layer 3 is so formed that its planar shape is asymmetric with respect to the first straight line 63 and axisymmetric with respect to the second straight line 64.

Figure 14:
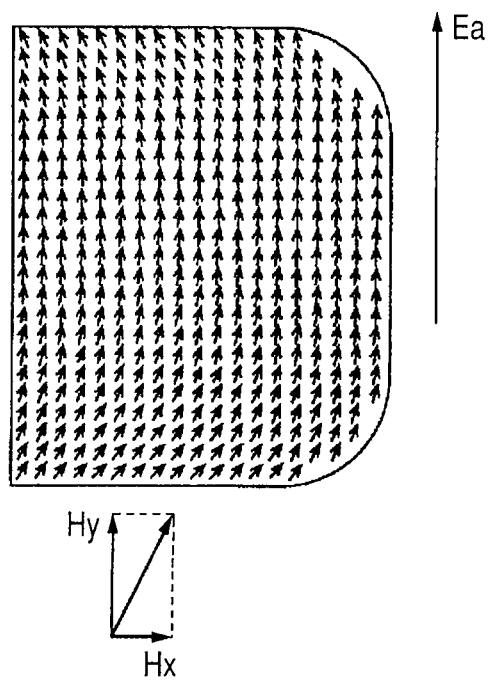
FIG. 14 is a plan view illustrating how magnetization takes place when the recording layer in FIG. 16 has C-shaped magnetization distribution.
Figure 15:
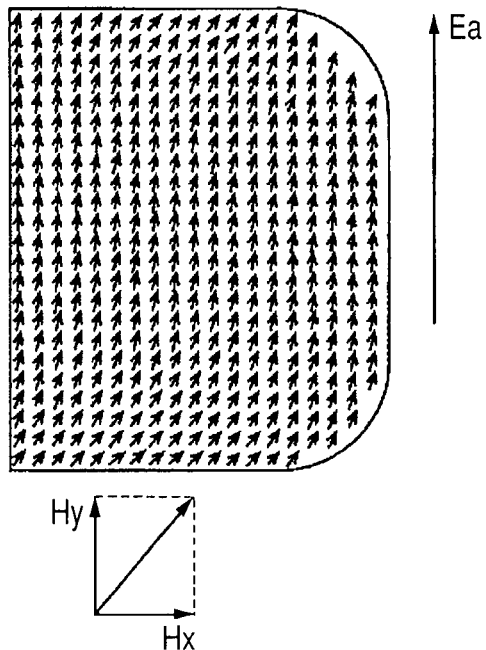
FIG. 15 is a plan view illustrating how magnetization takes place when the recording layer in FIG. 16 has S-shaped magnetization distribution.

As indicated as plot 35 in FIG. 12, the magnitude of bit line current IBL required for magnetization reversal pronouncedly varies depending on the magnitude of write line current IWT in the direction of easy axis of magnetization. This phenomenon is caused by a difference in magnetization state. FIG. 14 and FIG. 15 illustrate magnetization distributions in the following cases: cases where a synthetic magnetic field of a magnetic field in the direction of easy axis of magnetization and a magnetic field in the direction of hard axis of magnetization is smaller than the reversed magnetic field; and cases where the synthetic magnetic field is larger than the reversed magnetic field. They are plan views of a recording layer of a magnetic storage element in the first embodiment of the invention. The individual arrows in FIG. 14 and FIG. 15 indicate the directions of magnetization in the respective positions. In the examples in FIG. 14 and FIG. 15, magnetic fields are applied so that the respective magnetic fields Hy are identical in size and the respective magnetic fields Hx are different from each other in size. The magnetic field Hx applied in the example in FIG. 14 is smaller than the threshold value in the direction of hard axis of magnetization. The magnetic field Hx applied in the example in FIG. 15 is larger than the threshold value in the direction of hard axis of magnetization.

Figure 16A:
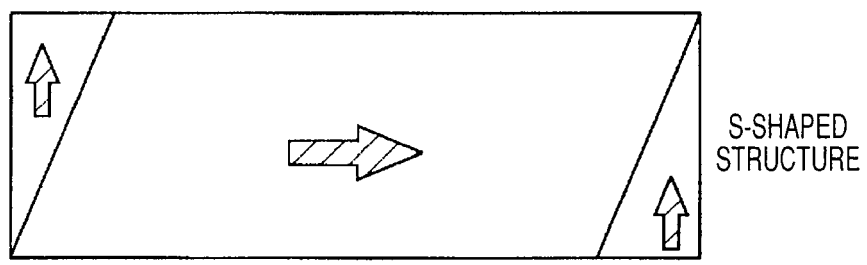
FIG. 16(a) is a conceptual diagram of the state of S-shaped magnetization distribution.
Figure 16B:
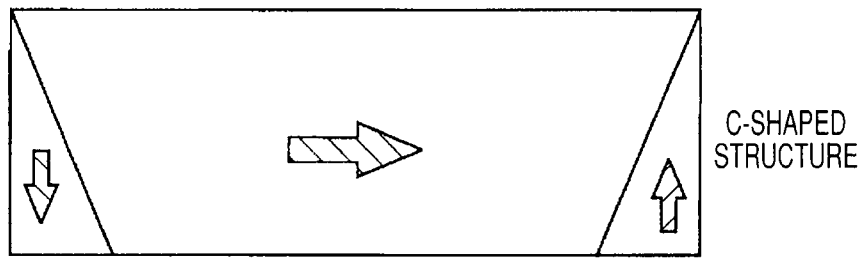
FIG. 16(b) is a conceptual diagram of the state of C-shaped magnetization distribution.
Figure 17:
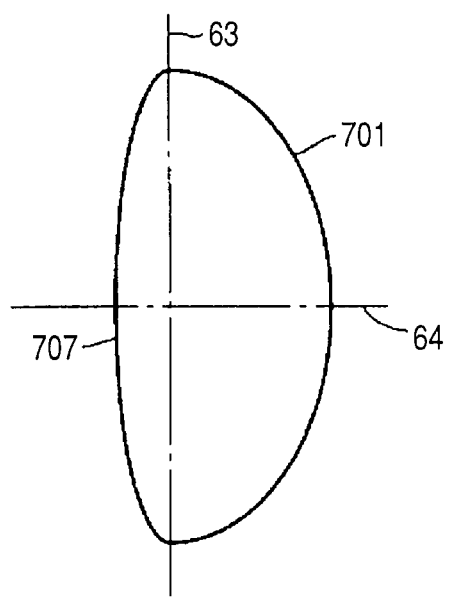
FIG. 17 is a plan view schematically illustrating the planar shape of a recording layer in a second modification to the first embodiment of the invention.
Figure 18:
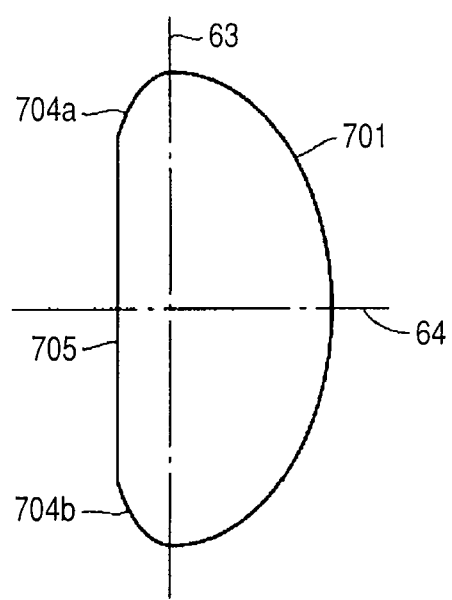
FIG. 18 is a plan view schematically illustrating the planar shape of a recording layer in a third modification to the first embodiment of the invention.
Figure 19:
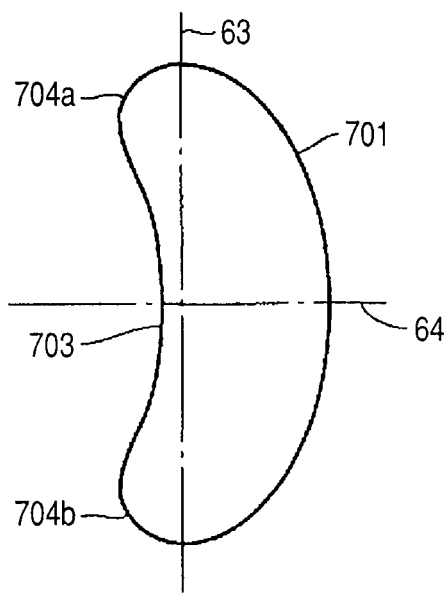
FIG. 19 is a plan view schematically illustrating the planar shape of a recording layer in a fourth modification to the first embodiment of the invention.
Figure 20:
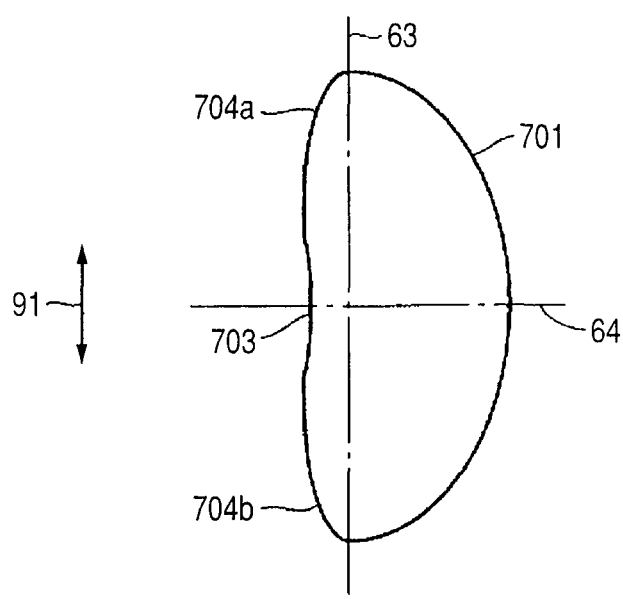
FIG. 20 is a plan view schematically illustrating the planar shape of a recording layer in a fifth modification to the first embodiment of the invention.

The pattern of the magnetization distribution illustrated in FIG. 14 is designated as C-shaped (first magnetization distribution). In the C-shaped magnetization distribution, the magnetization state is stable and the magnetization reversed magnetic field in the direction of easy axis of magnetization is enlarged. Meanwhile, the pattern of the magnetization distribution illustrated in FIG. 15 is designated as S-shaped (second magnetization distribution). The S-shaped magnetization distribution is susceptible to torque arising from an external magnetic field and the magnetization reversed magnetic field is drastically reduced in size. FIGS. 16(a) and 16(b) are conceptual diagrams illustrating the states of S-shaped and C-shaped magnetization distributions. The recording layer 3 in this embodiment has such a planar shape that the states of S-shaped and C-shaped magnetization distributions can be controlled by an external magnetic field. The recording layer 3 illustrated in FIG. 5 is also brought into the same states of magnetization distributions.

Description will be back to FIG. 5. Consideration will be given to a case where the curved portions 704a and 704b are respectively replaced by curved portions 704ap and 704bp to examine the following: what will take place when the shape of a recording layer is asymmetric with respect to the hard axis of magnetization. When a recording layer has a shape including only either the curved portion 704ap or the curved portion 704bp, the asteroid curve indicated as plot 36 or 37 is FIG. 12 is obtained. When write operation is carried out in the opposite direction in this case, the following takes place: the write current is a current with the sign of IBL of plot 37 reversed in correspondence with plot 36 or a current with the sign of IBL of plot 36 reversed in correspondence with plot 37. That is, the write current differs depending on direction even in the same bit.

When the value of current required for magnetization reversal fluctuates due to the asymmetry of shape in the direction of hard axis of magnetization (plots 36 and 37), the following takes place: the range (hatched range in the drawing) 46 in the recording layer 3 where magnetization reversal can be carried out is narrowed. This increases the current IBL and current IWT required for writing information into all these bits.

As mentioned above, the write characteristic of a magnetic storage device and the planar shape of its recording layer 3 are in close relation with reach other. For this reason, when the shape of recording layers 3 varies, the write characteristic varies from bit to bit. To reliably write information into each bit in the presence of this variation, it is required to increase a set value of write current. In conjunction with this increase in write current, the anchoring layer 1 is more greatly influenced when information is written. That is, the torque given to the magnetization of the anchoring layer 1 by a magnetic field produced by write current becomes considerable. When a magnetic field equivalent to or larger than the exchange force exerted on between the ferromagnetic film/nonmagnetic film/ferromagnetic film of the anchoring layer 1 in this case, the following takes place: the magnetizations M1b and M1d of the two ferromagnetic films 1b and 1d comprising the anchoring layer 1 transition from the antiparallel direction to saturation in the direction of magnetic field application. As a result, it is magnetically coupled with the recording layer 3 and the characteristic of the recording layer 3 can change.

According to this embodiment, the following can be implemented even when the shape of recording layers varies: the influence of the magnetization of the anchoring layer on the recording layer is minor and write operation can be more stabilized than with conventional structures. More specific description will be given. The magnetizations M1b and M1d (FIG. 4) in antiparallel state are made closer to parallel state by a synthetic magnetic field arising from a write line WT and a bit line BL (FIG. 3). Even in this case, the following can be implemented by satisfying Expression (1): the magnetic moment of the entire anchoring layer 1 is prevented from becoming so large that the magnetic moment of the recording layer 3 is exceeded. As a result, the influence of change in the magnetization state of the anchoring layer 1 on the recording layer 3 is suppressed. Therefore, variation in current required for changing the direction of the magnetization M3a of the ferromagnetic film 3a of the recording layer 3, that is, write current is suppressed.

Thus a magnetic storage device stable in write characteristic can be obtained.

Preferably, the following magnitude relation holds between the two terms on the right-hand side of Expression (1):

$$M1b \cdot t1b > M1d \cdot t1d \qquad (3)$$

Thus the influence of the magnetization M1d produced in a part of the anchoring layer 1 (FIG. 4) close to the recording layer 3 is suppressed. Therefore, the influence of the magnetization of the anchoring layer 1 on the recording layer 3 can be further suppressed.

The planar shape of the recording layer 3 is asymmetric with respect to the easy axis of magnetization 91. This makes it possible to ensure a large range of rewrite current with which the operation is feasible and thus stable rewrite operation can be carried out.

In the recording layer 3 illustrated in FIG. 5, as described above, its portion on the right side of the easy axis of magnetization 63 is comprised of an arc 701. When the scale of integration of MRAM is enhanced, it is difficult to control a shape having a small curvature because of photolithography or an etching step for forming the recording layer 3. However, the curved portion 701 in FIG. 5 has the same length as the maximum length L of the recording layer 3 along the direction of easy axis of magnetization 91. Therefore, it is easy to control and the influence of variation is reduced. In the above description, the shape of the recording layer includes an arc but it may include a curve described by any other quadratic function. The drawings from FIG. 17 to FIG. 20 are plan views respectively schematically illustrating the planar shape of a recording layer in second to fifth modifications to the first embodiment of the invention.

Even when a recording layer in the shape illustrated in any of FIG. 17 to FIG. 20 is used, the same effect can be obtained by providing it with the laminated structure illustrated in FIG. 4.

Second Embodiment

Figure 21:
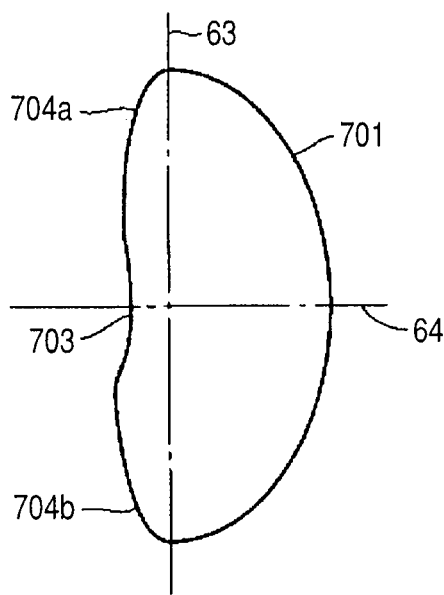
FIG. 21 is a plan view schematically illustrating the planar shape of a recording layer of a magnetic storage device in a second embodiment of the invention.

FIG. 21 is a plan view schematically illustrating the planar shape of a recording layer of a magnetic storage device in a second embodiment of the invention. The cross section structure in this embodiment is the same as in the first embodiment.

The curved portions 704a and 704b are different from each other in curvature and this recording layer is asymmetric in the direction of hard axis of magnetization. In this recording layer, the substantial easy axis of shape is inclined from the first straight line 63. With respect to the asteroid curve in this case, the magnitude of current as well as the direction of current differs when "1" or "0" is written, as described in relation to plot 36 in FIG. 12. Also in this case, however, the influence of the magnetization of the anchoring layer can be suppressed by providing the recording layer with the laminated structure illustrated in FIG. 4.

Any difference in the magnitude of current at the time of writing "1" and "0" can be corrected by utilizing this recording layer shape.

The regards related to the configuration other than the foregoing are substantially the same as the above-mentioned configuration of the first embodiment. Therefore, the same or corresponding elements will be marked with the same reference numerals and the description thereof will not be repeated.

According to this embodiment, the second part PTb is asymmetric with respect to the second straight line 64. Even in this case, variation in the write characteristic of the magnetic storage device is suppressed as described in relation to the first embodiment. Even when the recording layer 3 is symmetric, therefore, the write characteristic of the magnetic storage device can be stabilized.

Third Embodiment

Figure 22:
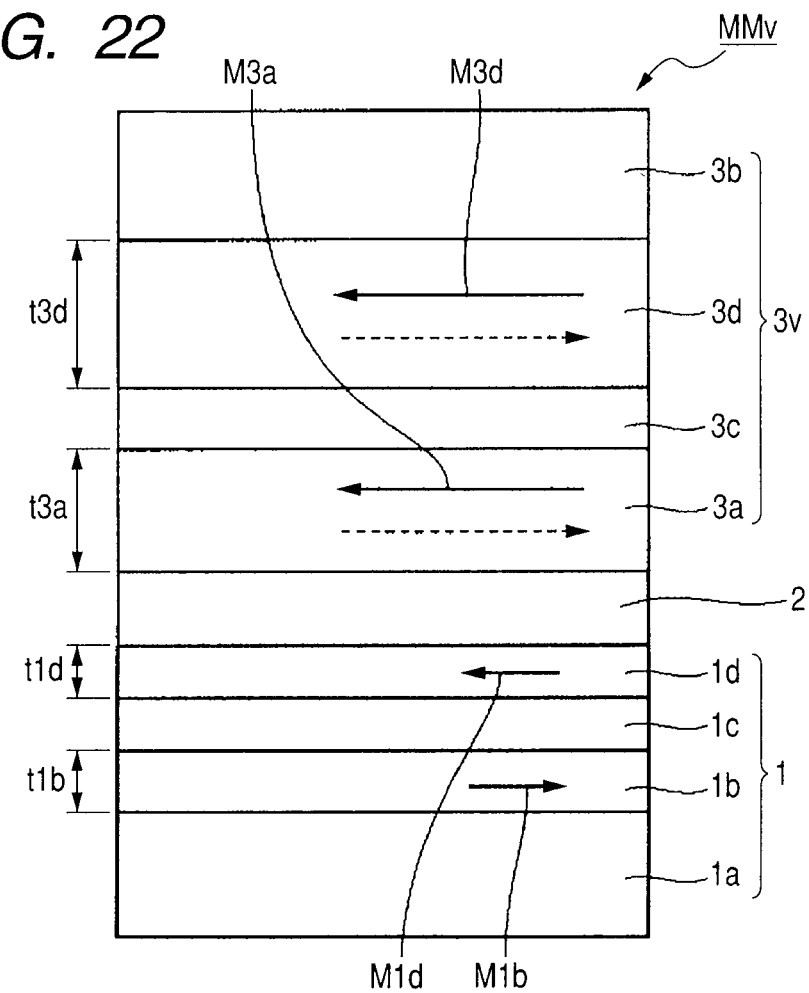
FIG. 22 is a sectional view schematically illustrating the configuration of a magnetic storage element of a magnetic storage device in a third embodiment of the invention.

FIG. 22 is a sectional view schematically illustrating the laminated structure of a recording layer of a magnetic storage device in a third embodiment of the invention. The planar shape of this recoding layer is the same as in the first embodiment.

Description will be given to this embodiment mainly with reference to FIG. 22. The magnetic storage device in this embodiment has a magnetic storage element MMv in place of the magnetic storage element MM (FIG. 4). The magnetic storage element MMv has a recording layer 3v in place of the recording layer 3 in the magnetic storage element MM (FIG. 4).

The recording layer 3v has such a structure that a ferromagnetic film 3a, a nonmagnetic film 3c (third nonmagnetic film), a ferromagnetic film 3d (fourth ferromagnetic film), and a nonmagnetic metal film 3b are laminated in this order over the tunnel insulating layer 2. The ferromagnetic film 3a is comprised of a cobalt alloy film and is 2 nm in thickness and the nonmagnetic film 3c is comprised of a ruthenium film 0.7 nm in thickness. The ferromagnetic film 3d is comprised of a cobalt alloy film and is nm in thickness. Its magnetization per unit volume is 1,100,000 A/m (1100 emu/cm$^3$). In this recording layer 3v, the magnetizations of the ferromagnetic films 3a and 3d are coupled with each other in the antiparallel direction with the ruthenium film 3c in-between as in the anchoring layer 1. Also in this recording layer, the magnetization is saturated in the direction of magnetic field when a large magnetic field is applied. To obtain the same effect as in the first embodiment, therefore, it is required to satisfy the following relation:

$$M3a \cdot t3a + M3d \cdot t3d > M1b \cdot t1b + M1d \cdot t1d \qquad (2)$$

The regards related to the configuration other than the foregoing are substantially the same as the above-mentioned configuration of the first embodiment. Therefore, the same or corresponding elements will be marked with the same reference numerals and the description thereof will not be repeated.

According to this embodiment, the effective magnetization of the recording layer that contributes to magnetization reversal can be adjusted by two ferromagnetic films. Further, the volume of the entire recording layer can be increased; therefore, it is possible to suppress loss of information that may be caused by thermal disturbance when the device is miniaturized.

The magnetic storage devices in the above embodiments may be combined devices having a logic circuit combined with memory cells MC (FIG. 1). In this case, high-speed operation can be carried out through stabilization of the write characteristic and this improves network environments and interactive environments for handling information in mobile communication. Further, power consumption can be reduced and operating environments can be significantly improved by applying these magnetic storage devices to computers, portable terminals, and the like.

In the description of the above embodiments, magnetic storage devices have been taken as examples. However, the relation between magnetoresistance effect elements, such as the magnetic storage element MM, and wiring layers related to write lines and bit lines is not limited to storage of information. This relation is also applicable to, for example, magnetic sensors, magnetic record heads, and magnetic devices of patterned magnetic elements in magnetic recording media and the like.

In the above description, magnetic storage devices in which one magnetic storage element MM is provided in one memory cell MC have been taken as examples. Instead, multiple magnetic storage elements MM may be provided in one memory cell MC and these magnetic storage elements MM may be stacked each other.

The embodiments disclosed here are just examples in every respect and the invention is not limited to these embodiments. The invention is shown in WHAT IS CLAIMED IS, not within the scope of the above description and it is meant that every modification within the meaning and scope equivalent to WHAT IS CLAIMED IS is in included in the invention.

The invention can be advantageously applied to magnetic storage devices having a recording layer and an anchoring layer.

What is claimed is:

1. A magnetic storage device comprising:
a substrate;
a first wiring provided over the substrate and having a portion extended along a first axis when the first axis is taken as a central axis;
a second wiring provided over the substrate, having a portion extended along a second axis crossing the first axis when the second axis is taken as a central axis, and crossing the first wiring with a gap in-between in a direction of a thickness of the substrate;
a recording layer having a planar shape, arranged so that at least part thereof is sandwiched between the first wiring and the second wiring in an area where the first wiring and the second wiring cross each other with the gap in-between, having an easy axis of magnetization, and having a magnetization direction thereof changed by a synthetic magnetic field of a magnetic field arising from the first wiring and a magnetic field arising from the second wiring;
a first nonmagnetic film provided over the recording layer; and
an anchoring layer provided over the first nonmagnetic film,
wherein the anchoring layer includes: a first ferromagnetic film provided over the first nonmagnetic film and having a first magnetization and a first film thickness; a second nonmagnetic film provided over the first ferromagnetic film; a second ferromagnetic film provided over the second nonmagnetic film, coupled in antiparallel with the first ferromagnetic film, and having a second magnetization and a second film thickness; and an antiferromagnetic film provided over the second ferromagnetic film, and
wherein a sum of a product of the first magnetization and the first film thickness and a product of the second magnetization and the second film thickness is smaller than a product of the magnetization of the recording layer and the film thickness of the recording layer,
wherein the product of the first magnetization and the first film thickness is smaller than the product of the second magnetization and the second film thickness, and
wherein the planar shape of the recording layer is asymmetric with respect to a direction of the easy axis of magnetization.

2. The magnetic storage device according to claim 1, wherein the planar shape is asymmetric with respect to the easy axis of magnetization.

3. The magnetic storage device according to claim 2, wherein the recording layer includes a third ferromagnetic film, a third nonmagnetic film provided over the third ferromagnetic film, and a fourth ferromagnetic film provided over the third nonmagnetic film.

4. The magnetic storage device according to claim 2, wherein at least either of the recording layer and the anchoring layer includes a ferromagnetic film having at least any of cobalt, iron, and nickel as a main component.

5. The magnetic storage device according to claim 2, wherein the second nonmagnetic film contains ruthenium.

6. The magnetic storage device according to claim 1, wherein the recording layer includes a third ferromagnetic film, a third nonmagnetic film provided over the third ferromagnetic film, and a fourth ferromagnetic film provided over the third nonmagnetic film.

7. The magnetic storage device according to claim 6, wherein at least either of the recording layer and the anchoring layer includes a ferromagnetic film having at least any of cobalt, iron, and nickel as a main component.

8. The magnetic storage device according to claim 6, wherein the second nonmagnetic film contains ruthenium.

9. The magnetic storage device according to claim 1, wherein at least either of the recording layer and the anchoring layer includes a ferromagnetic film having at least any of cobalt, iron, and nickel as a main component.

10. The magnetic storage device according to claim 9, wherein the second nonmagnetic film contains ruthenium.

11. The magnetic storage device according to claim 1, wherein the second nonmagnetic film contains ruthenium.

12. The magnetic storage device according to claim 1 wherein the planar shape of the recording layer is axisymmetric with a direction of an axis perpendicular to the easy axis of magnetization.

13. The magnetic storage device according to claim 12, wherein the recording layer is D-shaped as viewed along a direction perpendicular to the planar shape.

14. The magnetic storage device according to claim 12, wherein the recording layer is kidney-shaped as viewed along a direction perpendicular to the planar shape.

15. The magnetic storage device according to claim 12, wherein the recording layer has opposing outer surfaces which are convex-shaped as viewed along a direction perpendicular to the planar shape.

16. The magnetic storage device according to claim 1, wherein the recording layer has a maximum length in a direction of the easy axis of magnetization on a first straight line along the easy axis of magnetization,
wherein the recording layer has a first part and a second part which are divided by the first straight line, and
wherein a maximum length between an edge of the second part and the first straight line is smaller than a maximum length between an edge of the first part and the first straight line.

17. The magnetic storage device according to claim 16, wherein a portion of the edge of the first part is a smooth convex curve.

18. The magnetic storage device according to claim 17, wherein a portion of the edge of the second part is a smooth concave curve.

19. The magnetic storage device according to claim 16, wherein a portion of the edge of the second part that is at the maximum length between the edge of the second part and the first straight line is parallel to the first straight line and is connected to the outer edge of the first part by a smooth curve.

20. The magnetic storage device according to claim 16, wherein a portion of the edge of the second part that is at the maximum length between the edge of the second part and the first straight line is parallel to the first straight line and is connected to the outer edge of the first part by a line that is perpendicular to the first straight line.

* * * * *